US009738064B2

(12) United States Patent
Loccufier et al.

(10) Patent No.: US 9,738,064 B2
(45) Date of Patent: Aug. 22, 2017

(54) LITHOGRAPHIC PRINTING PLATE PRECURSOR

(75) Inventors: Johan Loccufier, Wondelgem (BE); Stefaan Lingier, Aarschot (BE); Heidi Janssens, Mortsel (BE)

(73) Assignee: Agfa Graphics N.V., Mortsel (BE)

( * ) Notice: Subject to any disclaimer, the term of this patent is extended or adjusted under 35 U.S.C. 154(b) by 924 days.

(21) Appl. No.: 13/511,439

(22) PCT Filed: Dec. 3, 2010

(86) PCT No.: PCT/EP2010/068850
§ 371 (c)(1),
(2), (4) Date: Jun. 20, 2012

(87) PCT Pub. No.: WO2011/067382
PCT Pub. Date: Jun. 9, 2011

(65) Prior Publication Data

US 2012/0266768 A1 Oct. 25, 2012

(30) Foreign Application Priority Data

Dec. 4, 2009 (EP) .................................... 09177986

(51) Int. Cl.
*G03F 7/004* (2006.01)
*B41F 1/18* (2006.01)
*G03F 7/20* (2006.01)
*B41C 1/10* (2006.01)

(52) U.S. Cl.
CPC .......... *B41C 1/1008* (2013.01); *B41C 1/1016* (2013.01); *B41C 2201/02* (2013.01); *B41C 2201/14* (2013.01); *B41C 2210/02* (2013.01); *B41C 2210/06* (2013.01); *B41C 2210/14* (2013.01); *B41C 2210/22* (2013.01); *B41C 2210/24* (2013.01); *B41C 2210/262* (2013.01)

(58) Field of Classification Search
None
See application file for complete search history.

(56) References Cited

U.S. PATENT DOCUMENTS

| | | | |
|---|---|---|---|
| 4,045,232 | A | 8/1977 | Parkinson |
| 4,981,517 | A | 1/1991 | DeSanto, Jr. et al. |
| 5,163,368 | A | 11/1992 | Pensavecchia et al. |
| 5,174,205 | A | 12/1992 | Kline et al. |
| 5,641,608 | A | 6/1997 | Grunwald et al. |
| 6,027,857 | A | 2/2000 | Li et al. |
| 6,071,675 | A | 6/2000 | Teng |
| 6,140,392 | A | 10/2000 | Kingman et al. |
| 6,171,735 | B1 | 1/2001 | Li et al. |
| 6,245,481 | B1 | 6/2001 | Teng |
| 6,420,089 | B1 | 7/2002 | Baumann et al. |
| 7,247,418 | B2 | 7/2007 | Saraiya et al. |
| 2003/0215744 | A1 | 11/2003 | Gries |
| 2007/0202438 | A1 | 8/2007 | Takamuki |
| 2009/0061352 | A1 * | 3/2009 | Hauck et al. .............. 430/270.1 |
| 2009/0170028 | A1 * | 7/2009 | Loccufier .............. B41C 1/1008 430/283.1 |

FOREIGN PATENT DOCUMENTS

| | | | |
|---|---|---|---|
| DE | 1447963 | A1 | 11/1968 |
| DE | 4007428 | A1 | 9/1991 |
| DE | 4027301 | A1 | 3/1992 |
| DE | 4445820 | A1 | 6/1996 |
| EP | 0360151 | A1 | 9/1989 |
| EP | 0400706 | A1 | 12/1990 |
| EP | 0625728 | A2 | 11/1994 |
| EP | 0823327 | A2 | 2/1998 |
| EP | 0864420 | A1 | 9/1998 |
| EP | 0894622 | A2 | 2/1999 |
| EP | 0901902 | A2 | 3/1999 |
| EP | 0825927 | B1 | 8/1999 |
| EP | 0933682 | A2 | 8/1999 |
| EP | 0934822 | A1 | 8/1999 |
| EP | 0950517 | A1 | 10/1999 |
| EP | 0950518 | A1 | 10/1999 |
| EP | 0978376 | A2 | 2/2000 |
| EP | 0982123 | A2 | 3/2000 |
| EP | 1025992 | A1 | 8/2000 |
| EP | 1029667 | A1 | 8/2000 |
| EP | 1053868 | A2 | 11/2000 |
| EP | 1072432 | A2 | 1/2001 |
| EP | 1074386 | A2 | 2/2001 |
| EP | 1074889 | A2 | 2/2001 |
| EP | 1093934 | A1 | 4/2001 |
| EP | 1120246 | A2 * | 8/2001 |
| EP | 0720053 | B1 | 9/2002 |
| EP | 1318027 | A2 | 6/2003 |
| EP | 1356926 | A1 | 10/2003 |
| EP | 1400351 | A2 | 3/2004 |
| EP | 1506854 | A1 | 2/2005 |
| EP | 1506858 | A2 | 2/2005 |

(Continued)

OTHER PUBLICATIONS

Anon., "Hammett Sigma Constants," *Wired Chemist*, 2 pp., downloaded from the Internet at http://wiredchemist.com/chemistry/data/hammett_sigma_constants.html on May 18, 2012 in Reference to C. Hansch and A. Leo, "Substituent Constraints for Correlation Analysis in Chemistry and Biology," Wiley-Interscience, NY (1979).

(Continued)

*Primary Examiner* — Quang X Nguyen
(74) *Attorney, Agent, or Firm* — Leydig, Voit & Mayer, Ltd.

(57) ABSTRACT

A positive-working lithographic printing plate precursor is disclosed which comprises on a support having a hydrophilic surface or which is provided with a hydrophilic layer a heat and/or light-sensitive coating including an infrared absorbing agent, said heat and/or light-sensitive coating comprising a first layer comprising a binder including a monomeric unit including a sulfonamide group; characterized in that the binder further comprises a monomeric unit including a phosphonic acid group or a salt thereof, and that the monomeric unit comprising the phosphonic acid group is present in an amount comprised between 2 mol % and 15 mol %.

14 Claims, No Drawings

(56) References Cited

FOREIGN PATENT DOCUMENTS

| | | | |
|---|---|---|---|
| EP | 1342568 | B1 | 10/2005 |
| EP | 1614538 | A2 | 1/2006 |
| EP | 1614539 | A1 | 1/2006 |
| EP | 1614540 | A1 | 1/2006 |
| EP | 1630608 | A2 | 3/2006 |
| EP | 1642745 | A2 | 4/2006 |
| EP | 1447238 | B1 | 12/2006 |
| EP | 1757981 | A1 | 2/2007 |
| EP | 1826001 | A1 | 8/2007 |
| EP | 1826021 | A1 * | 8/2007 |
| EP | 1884359 | A1 | 2/2008 |
| EP | 1916101 | A2 | 4/2008 |
| EP | 1588220 | B1 | 10/2008 |
| GB | 1154749 | | 6/1969 |
| JP | 63-077903 | A | 4/1988 |
| WO | WO 97/39894 | | 10/1997 |
| WO | WO 99/01795 | | 1/1999 |
| WO | WO 99/21715 | | 5/1999 |
| WO | WO 99/63407 | | 12/1999 |
| WO | WO 00/29214 | | 5/2000 |
| WO | WO 00/32705 | | 6/2000 |
| WO | WO 01/45958 | A2 | 6/2001 |
| WO | WO 02/101469 | A1 | 12/2002 |
| WO | WO 2004/030923 | A2 | 4/2004 |
| WO | WO 2004/030924 | A1 | 4/2004 |
| WO | WO 2004/030925 | A1 | 4/2004 |
| WO | WO 2004/035310 | A1 | 4/2004 |
| WO | WO 2004/035645 | A1 | 4/2004 |
| WO | WO 2004/035686 | A2 | 4/2004 |
| WO | WO 2004/035687 | A1 | 4/2004 |
| WO | WO 2004/071767 | A1 | 8/2004 |
| WO | WO 2005/111727 | A1 | 11/2005 |
| WO | WO 2006/005688 | A1 | 1/2006 |
| WO | WO 2007/107494 | A1 | 9/2007 |

OTHER PUBLICATIONS

European Patent Office, International Search Report in PCT/EP2010/068850, 2 pp. (Feb. 28, 2011).

International Search Report in corresponding International Patent Application No. PCT/EP2010/068850, mailed Feb. 28, 2011.

International Preliminary Report on Patentability in corresponding International Patent Application No. PCT/EP2010/068850, mailed Jun. 5, 2012.

* cited by examiner

LITHOGRAPHIC PRINTING PLATE PRECURSOR

CROSS-REFERENCE TO RELATED APPLICATIONS

The present application is the U.S. national stage of PCT/US2010/068850, filed Dec. 3, 2010, claiming the benefit of European Patent Application No. 09177986.8, filed Dec. 4, 2009; the disclosures of the '850 and '986 applications are incorporated by reference.

FIELD OF THE INVENTION

The present invention relates to a positive-working lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plate precursors, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer, heat-induced solubilization or particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-625, 728.

In the graphic arts industry, there is an evolution towards the use of recycled paper and more abrasive inks, fountain solutions and/or plate cleaners. These harsh printing conditions, especially occurring on web presses, not only impose more stringent demands on the chemical resistance of the printing plates towards pressroom chemicals and inks but also reduce their press life. To improve the chemical resistance and/or press life of positive-working plates based on oleophilic resins, often a heat-treatment is carried out after the exposure and development steps. However, this heat-treatment, also known as post-baking, is both energy and time consuming. Other solutions to these issues have been provided in the art by optimizing the coatings for example by selection of specific alkaline soluble resins—e.g. by chemical modification—and/or by providing double layer coatings. Such coatings typically include a first layer comprising a highly solvent resistant alkaline soluble resin and a second layer on top of this first layer comprising a phenolic resin for image formation. In addition, positive-working printing plate precursors based on a solubility difference may suffer from an insufficient development latitude, i.e. the dissolution of the exposed areas in the developer is not completely finished before the unexposed areas also start dissolving in the developer. This often results in insufficient clean-out leading to toning (ink-acceptance in the non-image areas), a loss of coating (small image details) in the image areas, a reduced press life and/or a reduced chemical resistance of the printing plate.

EP 1 826 001 discloses a heat-sensitive, positive-working lithographic printing plate precursor comprising on a support having a hydrophilic surface or which is provided with a hydrophilic layer a heat-sensitive coating comprising an IR absorbing agent, a phenolic resin and a polymer including a monomeric unit having a sulfonamide group.

U.S. Pat. No. 7,247,418 discloses an imageable element comprising a substrate, a radiation absorbing compound and a polymer comprising a polymer backbone and pendant phosphoric acid groups, pendant adamantyl groups, or both, provided that the adamantyl groups are connected to the polymer backbone through an urea or urethane linking group.

EP 1 884 359 discloses a heat-sensitive positive working printing plate comprising on a substrate a bottom layer including a sulfonamide containing polymer and an ink-accepting top layer which comprises a polymeric material including a polymer backbone and pendant phosphonic acid groups and/or phosphate groups and which has an acid number up to 60 mg KOH/g polymer.

EP 1 318 027 discloses a printing plate precursor comprising a hydrophilic polymer including a reactive group chemically bonded to an aluminum substrate and a positive working recording layer including a homopolymer having an acidic group selected from a phenolic hydroxyl group, a (substituted) sulfonamide group, a carboxylic acid group, a sulfonic acid group or a phosphoric acid group.

EP 1 757 981 discloses a photopolymer printing plate precursor comprising a photosensitive coating having a composition comprising at least a binder which is a copolymer having monomeric units substituted by at least one acidic group. The acidic group may be selected from a carboxylic acid group, a carboxylic anhydride group, a sulfo group, an imino group, a phosphono group, a N-acyl sulfonamido group or a phenolic hydroxy group.

WO 2007/107494 discloses a method of making a lithographic printing plate comprising the steps of: (1) providing a heat-sensitive lithographic printing plate precursor comprising on a support, having a hydrophilic surface or which is provided with a hydrophilic layer, a heat-sensitive coating, (2) image-wise exposing said precursor, and (3) developing said image-wise exposed precursor with an alkaline developing solution comprising a compound having at least two onium groups.

SUMMARY OF THE INVENTION

It is an object of the present invention to provide a positive-working lithographic printing plate characterized by a high quality and a high press life. High-quality printing plate precursors are defined as precursors having a high sensitivity, a broad development latitude and a high chemical resistance of the coating.

The sensitivity is defined as the minimum energy required to obtain a sufficient differentiation between the exposed and non-exposed area such that the exposed areas are completely removed by the developer without substantially affecting the non-exposed areas. The development latitude is a measure of the level of the difference in dissolving rate. The chemical resistance means the resistance of the coating against printing liquids such as inks, e.g. UV-inks, fountain solutions, plate and blanket cleaners.

The object of the present invention is realized by claim 1, i.e. a lithographic printing plate precursor, which comprises on a support having a hydrophilic surface or which is provided with a hydrophilic layer, a heat and/or light-sensitive coating including an infrared absorbing agent, said heat and/or light-sensitive coating comprising a first layer comprising a binder including a monomeric unit including a sulfonamide group; characterized in that the binder further comprises a monomeric unit including a phosphonic acid group or a salt thereof, and that the monomeric unit including the phosphonic acid group is present in an amount comprised between 2 mol % and 15 mol %.

Other features, elements, steps, characteristics and advantages of the present invention will become more apparent from the following detailed description. Specific embodiments of the invention are also defined in the dependent claims.

DETAILED DESCRIPTION OF THE INVENTION

The lithographic printing plate precursor according to the present invention comprises a heat and/or light sensitive coating and is positive-working, i.e. after exposure and development the exposed areas of the coating are removed from the support and define hydrophilic (non-printing) areas, whereas the unexposed coating is not removed from the support and defines oleophilic (printing) areas.

The binder according to the present invention comprises a monomeric unit including a phosphonic acid group or a salt thereof. The monomeric unit including the phosphonic acid group or a salt thereof is preferably derived from monomers selected from an optionally substituted vinyl phosphonic acid, a phosphonate substituted styrene derivative or a monomer according to Formula I and/or Formula II; and/or salts thereof. The binder according to the present invention may comprise combinations of these monomers.

Formula I

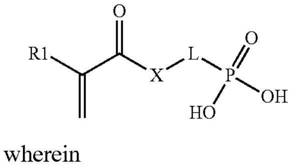

wherein $R^1$ represents hydrogen or an alkyl group;

L represents an optionally substituted alkylene, arylene, hetero-arylene, alkarylene or aralkylene group, or combinations thereof;

X represents O or $NR^2$ wherein $R^2$ represents hydrogen, an optionally substituted alkyl, alkenyl, alkynyl, aralkyl, alkaryl, aryl or heteroaryl group. Preferably, $R^2$ represents hydrogen or an optionally substituted alkyl group; most preferably, $R^2$ represents hydrogen.

Formula II

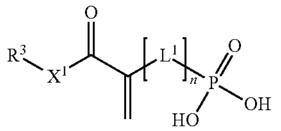

wherein $R^3$ represents hydrogen, an alkyl, alkenyl, alkynyl, aryl, aralkyl, alkaryl or heteroaryl group;

$L^1$ represents an optionally substituted alkylene, alkenylene, alkynylene, arylene, hetero-arylene, alkarylene or aralkylene group, $—X^3—(CH_2)_k—$, $—(CH_2)_l—X^4—$ or combinations thereof; wherein $X^3$ and $X^4$ independently represent O, S or NR' wherein R' represents hydrogen, an optionally substituted alkyl, alkenyl, alkynyl, aralkyl, alkaryl, aryl or heteroaryl group, and k and l independently represent an integer greater than 0;

n represents 0 or 1;

$X^1$ represents O or $NR^4$ wherein $R^4$ represents hydrogen, an optionally substituted alkyl, alkenyl, alkynyl, aralkyl, alkaryl, aryl or heteroaryl group. Preferably, $R^4$ represents hydrogen or an optionally substituted alkyl group; most preferably, $R^4$ represents hydrogen.

In a preferred embodiment the binder according to the present invention comprises a monomeric unit derived from a monomer according to formula I and/or salts thereof wherein X represents NH; $R^1$ represents hydrogen or an alkyl group and L represents an optionally substituted alkylene, arylene, alkarylene or aralkylene group or combinations thereof.

The monomeric unit including the phosphonic acid group or a salt thereof derived from monomers selected from a phosphonate substituted styrene derivative are preferably represented by $$CHR^5{=}CR^6—C_6H_{(5-n')}\text{-}[(L^2)_p—PO_3H_2]_{n'}$$

wherein $R^5$ and $R^6$ independently represent hydrogen or an alkyl group, $L^2$ represents an optionally substituted alkylene, arylene, hetero-arylene, alkarylene or aralkylene group, or combinations thereof;

p is an integer equal to 0 or 1, and n' is an integer equal to 1 to 5. Preferably, n' is an integer equal to 1, 2 or 3. Most preferably, n' is an integer equal to 1.

The optional substituents on the linking groups L, $L^1$ and $L^2$ may be selected from an alkyl, cycloalkyl, alkenyl or cyclo alkenyl group, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an ester thereof, a sulphonic acid group or an ester thereof, a phosphonic acid group or an ester thereof, a phosphoric acid group or an alkyl ester thereof, an amino group, a sulphonamide group, an amide group, a nitro group, a nitrile group, a halogen, or a combination thereof.

Without being limited thereto, typical examples of monomers including a phosphonic acid group are given below.

PHOS-1

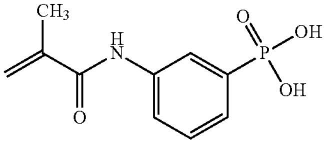

PHOS-2

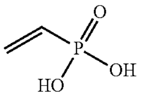

PHOS-3

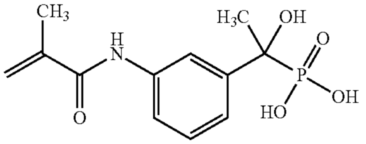

PHOS-4

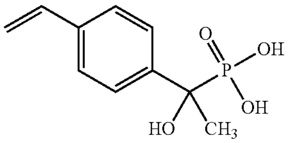

PHOS-5

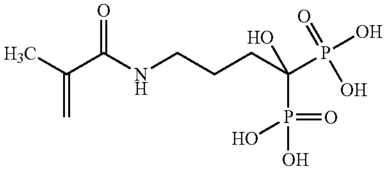

PHOS-6

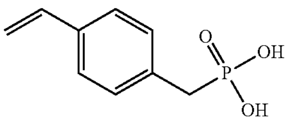

PHOS-7

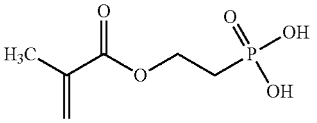

PHOS-8

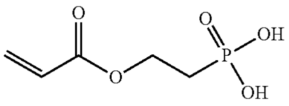

PHOS-9

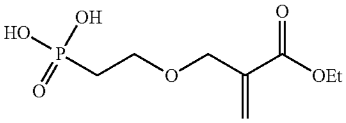

PHOS-10

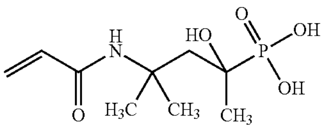

The binder according to the present invention further includes a monomeric unit including a sulfonamide group. The monomeric unit containing a sulfonamide group is preferably a monomeric unit including a sulphonamide group represented by —$NR^j$—$SO_2$—, —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl, alkaryl, heteroaralkyl group or combinations thereof.

The monomeric unit including a sulfonamide group is more preferably derived form the monomer according to formula III.

Formula III

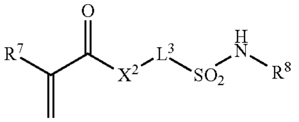

wherein $R^7$ represents hydrogen or an alkyl group;

$X^2$ represents O or $NR^9$; wherein $R^9$ represents hydrogen, an optionally substituted alkyl, alkenyl, alkynyl, aralkyl alkaryl, aromatic or hetero-aromatic group;

$L^3$ represents an optionally substituted alkylene, arylene, hetero-arylene, alkarylene, aralkylene group or hetero-arylene, —O—$(CH_2)_{k'}$—, —$(CH_2)_{l'}$—O—, or combinations thereof, wherein k' and l' independently represent an integer greater than 0;

$R^8$ represents hydrogen, an optionally substituted alkyl group such as methyl, ethyl, propyl or isopropyl, a cycloalkyl group such as cyclopentane, cyclohexane, 1,3-dimethylcyclohexane, alkenyl, alkynyl, aralkyl, alkaryl, an aryl group such as benzene, naphthalene or antracene, or a heteroaryl aryl group such as furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine, benzofuran, benzothiophene, indole, indazole, benzoxazole, quinoline, quinazoline, benzimidazole or benztriazole or an acyl group.

In a preferred embodiment the monomeric unit including a sulfonamide group is derived form the monomer according to formula III wherein $X^2$ represents $NR^9$ and $R^9$ represents hydrogen or an optionally substituted alkyl group, and $L^3$ represents a hetero-arylene, aralkylene, alkarylene or an arylene group.

In a more preferred embodiment the monomeric unit including a sulfonamide group is derived form the monomer according to formula III wherein $X^2$ represents NH and $L^3$ represents an arylene group.

The optional substituents on the groups above may be selected from an alkyl, cycloalkyl, alkenyl or cyclo alkenyl group, an aryl or heteroaryl group, halogen, an alkylaryl or arylalkyl group, an alkoxy or aryloxy group, a thio alkyl, thio aryl or thio heteroaryl group, a hydroxyl group, —SH, a carboxylic acid group or an ester thereof, a sulphonic acid group or an ester thereof, a phosphonic acid group or an ester thereof, a phosphoric acid group or an ester thereof, an amino group, a sulphonamide group, an amide group, a nitro group, a nitrile group, or a combination of at least two of these groups, including at least one of these groups which is further substituted by one of these groups.

Further suitable examples of sulfonamide polymers and/or their method of preparation are disclosed in EP 933 682, EP 982 123, EP 1 072 432, WO 99/63407 and EP 1 400 351. Without being limited thereto, typical sulfonamide monomeric units are given below as monomers:

SULF-1
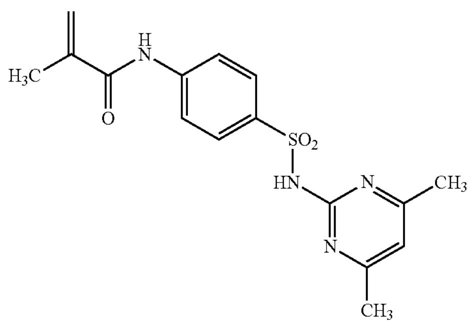
SULF-2
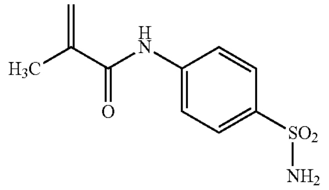
SULF-3
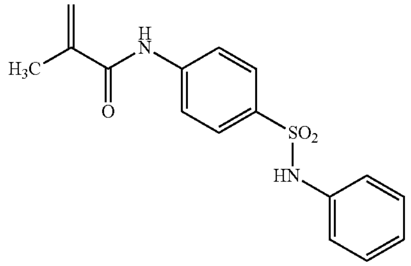
SULF-4
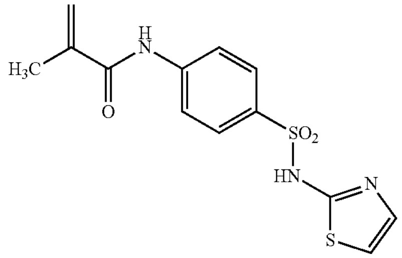
SULF-5
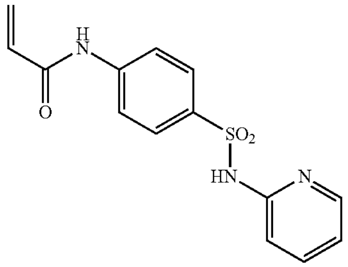
SULF-6
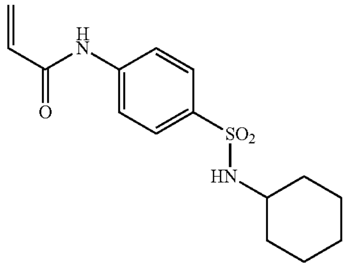
-continued
SULF-7
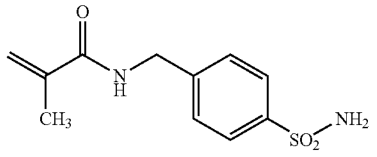
SULF-8
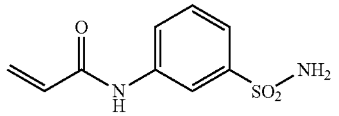
SULF-9
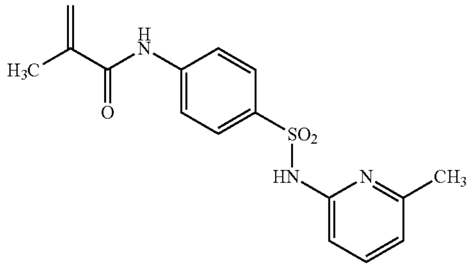
SULF-10
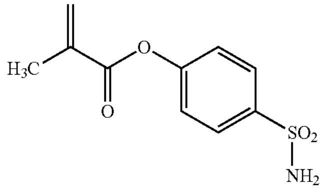
SULF-11
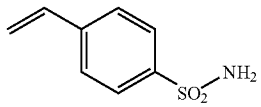
SULF-12
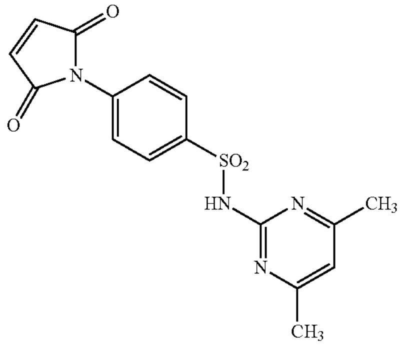
SULF-13
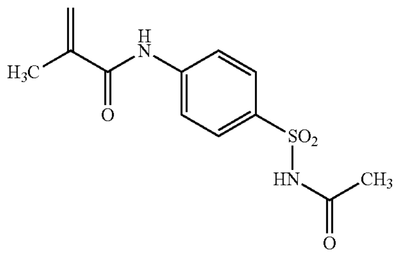

-continued

SULF-14

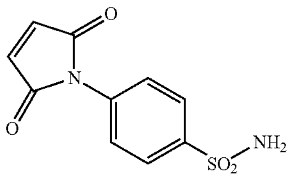

SULF-15

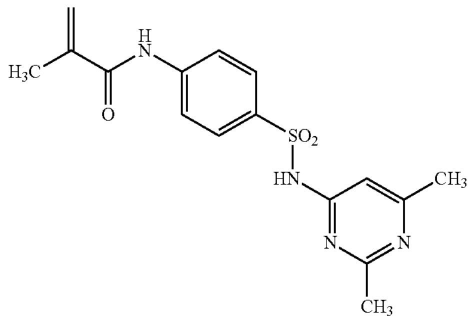

SULF-16

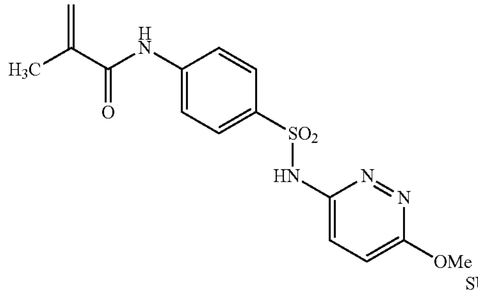

SULF-17

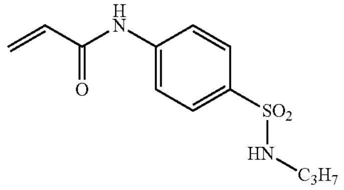

SULF-18

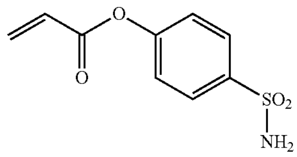

SULF-19

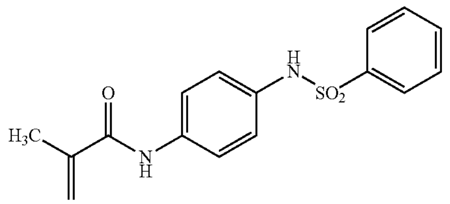

The binder according to the present invention may further comprise one or more other monomeric units, preferably selected from an acrylate or methacrylate e.g. an alkyl or aryl (meth)acrylate such as methyl (meth)acrylate, ethyl (meth)acrylate, butyl (meth)acrylate, benzyl (meth)acrylate, 2-phenylethyl (meth)acrylate, hydroxylethyl (meth)acrylate, phenyl (meth)acrylate or N-(4-methylpyridyl)(meth)acrylate; (meth)acrylic acid; a (meth)acrylamide e.g. (meth) acrylamide or a N-alkyl or N-aryl (meth)acrylamide such as N-methyl (meth)acrylamide, N-ethyl (meth)acrylamide, N-phenyl (meth)acrylamide, N-benzyl (meth)acrylamide, N-methylol (meth)acrylamide, N-(4-hydroxyphenyl)(meth) acrylamide; (meth)acrylonitrile; styrene; a substituted styrene such as 2-, 3- or 4-hydroxy-styrene, 4-benzoic acid-styrene; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl nitrile; vinyl acetal; vinyl butyral; a vinyl ether such as methyl vinyl ether; vinyl amide; a N-alkyl vinyl amide such as N-methyl vinyl amide, caprolactame, vinyl pyrrolydone; maleic anhydride, a maleimide e.g. maleimide or a N-alkyl or N-aryl maleimide such as N-benzyl maleimide.

In a preferred embodiment, the binder further comprises monomeric units selected from a (meth)acrylamide such as (meth)acrylamide, phenyl (meth)acrylamide and methylol (meth)acrylamide; (meth)acrylic acid; a maleimide e.g. maleimide or a N-alkyl or N-aryl maleimide such as N-benzyl maleimide, (meth)acrylates such as methyl (meth)acrylate, phenyl(meth)acrylate, hydroxyethyl (meth)acrylate or benzyl (meth)acrylate; vinyl nitrile or vinyl pyrrolidone.

In a highly preferred embodiment the binder according to the present invention comprises a monomeric unit according to the formula I wherein $R^1$ represents hydrogen or an alkyl group, X represents NH and L represents an optionally substituted arylene, hetero-arylene, alkarylene or aralkylene group;

a monomeric unit including a sulfonamide group derived form the monomer according to formula III wherein $X^2$ represents NH, $L^3$ represents an arylene, hetero-arylene, aralkylene, alkarylene or an arylene group, $R^7$ represents hydrogen or an alkyl group and $R^8$ represents hydrogen, or an optionally substituted aryl or heteroaryl aryl group; and and optionally a monomeric unit derived from (meth) acrylamide monomer such as (meth)acrylamide, phenyl (meth)acrylamide and methylol (meth)acrylamide.

In a second highly preferred embodiment the binder according to the present invention comprises a monomeric unit derived from vinyl phosphonate;

a monomeric unit including a sulfonamide group derived form the monomer according to formula III wherein $X^2$ represents NH and $L^3$ represents an arylene, hetero-arylene, aralkylene, alkarylene or an arylene group, $R^7$ represents hydrogen or an alkyl group and $R^8$ represents hydrogen, or an optionally substituted aryl or heteroaryl aryl group; and and optionally a monomeric unit derived from (meth) acrylamide monomer such as (meth)acrylamide, phenyl (meth)acrylamide and methylol (meth) acrylamide.

The amount of the monomeric unit comprising the phosphonic acid group or salt thereof in the binder is comprised between 2 and 15 mol %, preferably between 4 and 12 mol % and most preferably between 6 and 10 mol %. The amount of the monomeric unit including a sulfonamide monomer in the binder is preferably between 40 and 85 mol %, more preferably between 50 and 75 mol % and most preferably between 55 and 70 mol %. The binder according to the present invention preferably has a molecular weight ranging $M_w$ i.e. number average molecular weight, between 10000 and 150000, more preferably between 15000 and 100000, most preferably between 20000 and 80000, and $M_w$ i.e. weight average molecular weight, between 10000 and 500000, more preferably between 30000 and 300000, most preferably between 40000 and 280000. These molecular weights are determined by the method as described in the Examples.

Optionally, the coating may further comprise one or more binders selected from hydrophilic binders such as homopolymers and copolymers of vinyl alcohol, (meth)acrylamide, methylol (meth)acrylamide, (meth)acrylic acid, hydroxyethyl (meth)acrylate, maleic anhydride/vinylmethylether copolymers, copolymers of (meth)acrylic acid or vinylalcohol with styrene sulphonic acid; hydrophobic binders such as phenolic resins (e.g. novolac, resoles or polyvinyl phenols); chemically modified phenolic resins or polymers containing a carboxyl group, a nitrile group or a maleimide group as described in DE 4 007 428, DE 4 027 301 and DE 4 445 820; polymers having an active imide group such as $—SO_2—NH—CO—R^h$, $—SO_2—NH—SO_2—R^h$ or $—CO—NH—SO_2—R^h$ wherein $R^h$ represents an optionally substituted hydrocarbon group such as an optionally substituted alkyl, aryl, alkaryl, aralkyl or heteroaryl group; polymers comprising a N-benzyl-maleimide monomeric unit as described in EP 933 682, EP 894 622 (page 3 line 16 to page 6 line 30), EP 982 123 (page 3 line 56 to page 51 line 5), EP 1 072 432 (page 4 line 21 to page 10 line 29) and WO 99/63407 (page 4 line 13 to page 9 line 37); polymers having an acidic group which can be selected from polycondensates and polymers having free phenolic hydroxyl groups, as obtained, for example, by reacting phenol, resorcinol, a cresol, a xylenol or a trimethylphenol with aldehydes, especially formaldehyde, or ketones; condensates of sulfamoyl- or carbamoyl-substituted aromatics and aldehydes or ketones; polymers of bismethylol-substituted ureas, vinyl ethers, vinyl alcohols, vinyl acetals or vinylamides and polymers of phenylacrylates and copolymers of hydroxyphenylmaleimides; polymers having units of vinylaromatics, N-aryl(meth)acrylamides or aryl (meth)acrylates containing optionally one or more carboxyl groups, phenolic hydroxyl groups, sulfamoyl groups or carbamoyl groups such as polymers having units of 2-hydroxyphenyl (meth) acrylate, of N-(4-hydroxyphenyl)(meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide; vinylaromatics, methyl (meth)acrylate, phenyl(meth)acrylate, benzyl (meth) acrylate, methacrylamide or acrylonitrile.

Typical generic structures of binders, according to the present invention are given below, without being limited thereto.

Resin-1

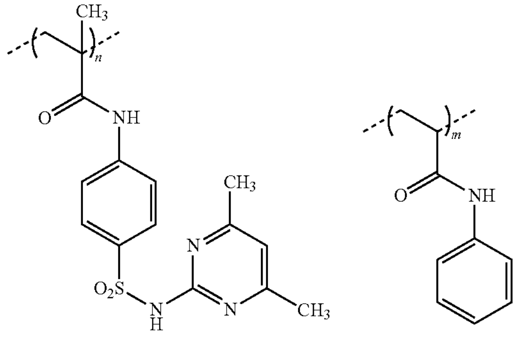

-continued

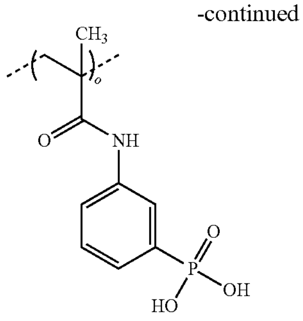

Resin-2

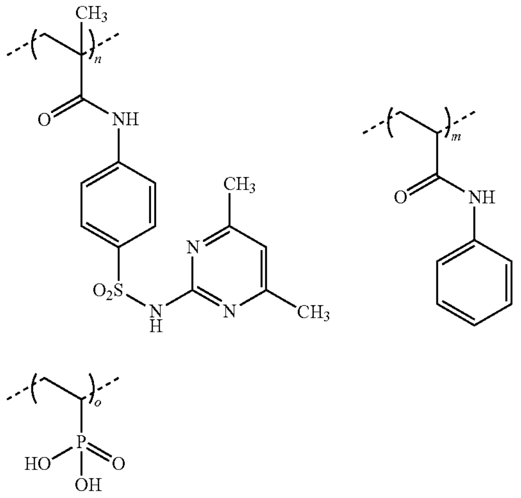

Resin-3

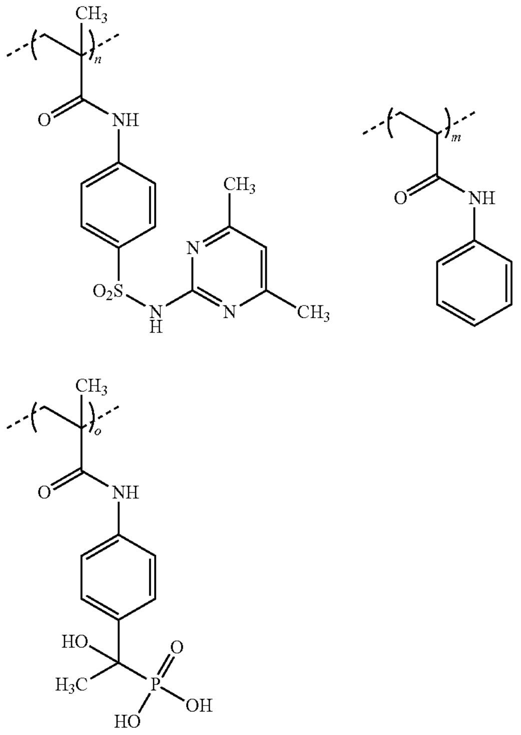

-continued
Resin-4
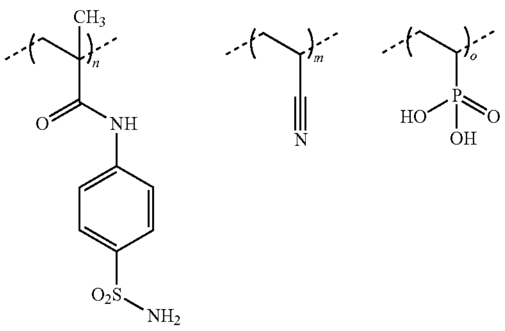
Resin-5
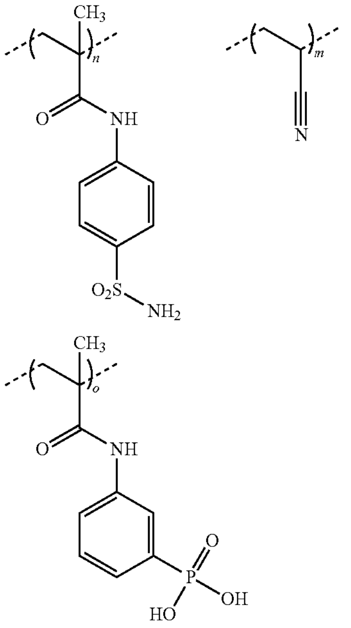
Resin-6
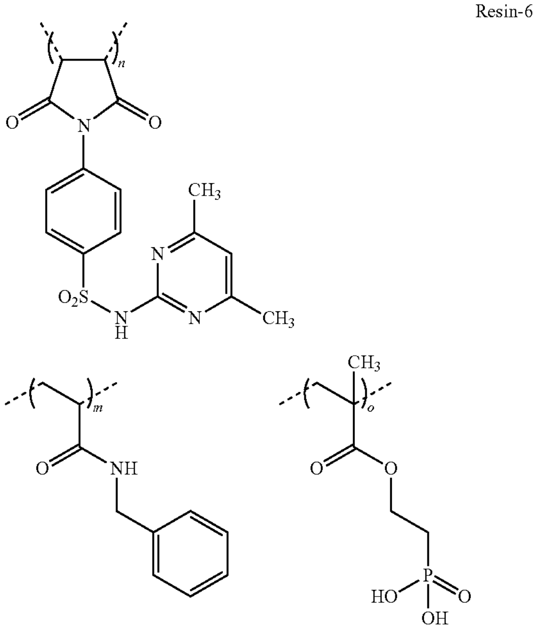
-continued
Resin-7
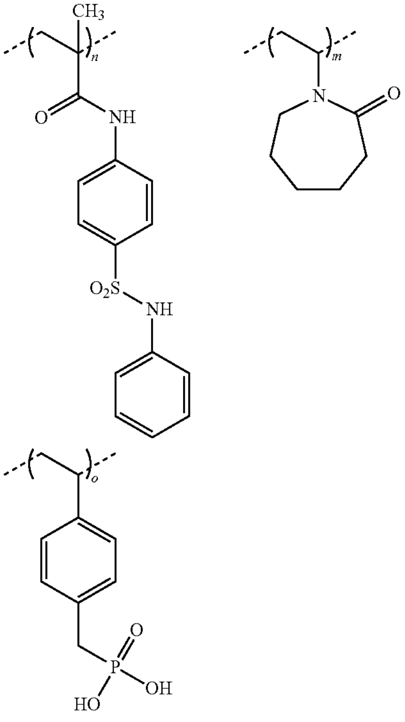
Resin-8
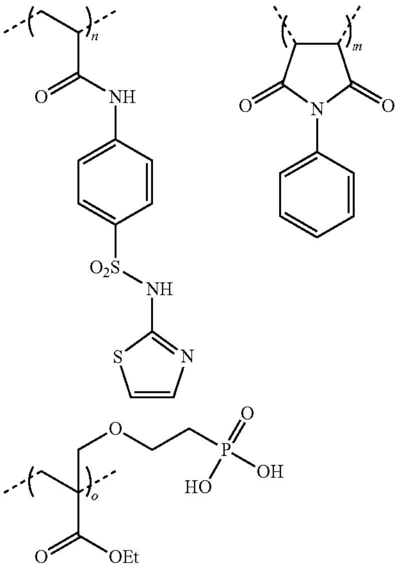
Resin-9
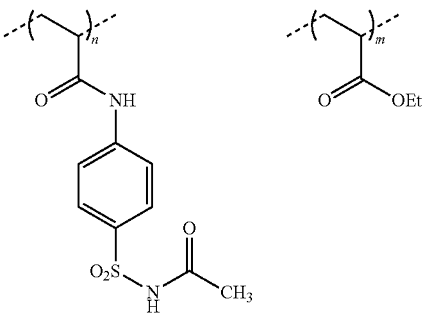

-continued
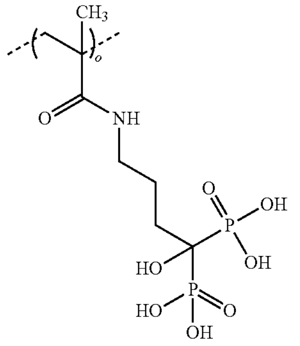
Resin-10
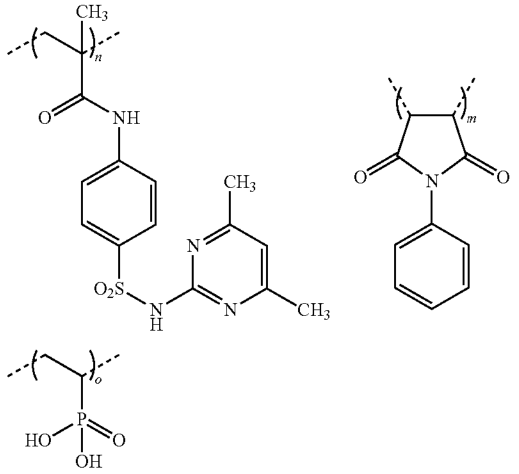
Resin-11
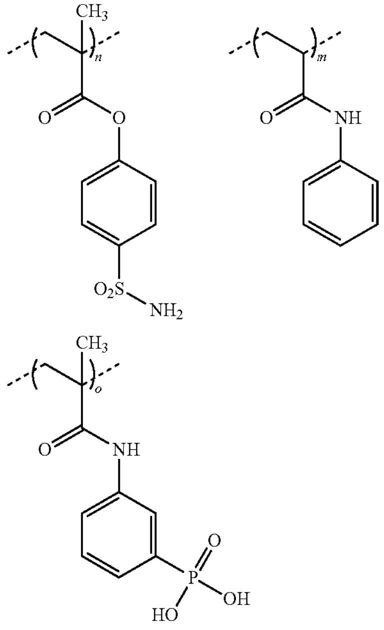
-continued
Resin-12
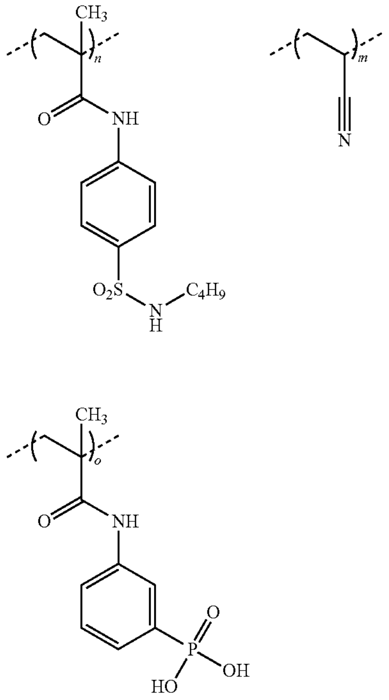
Resin-13
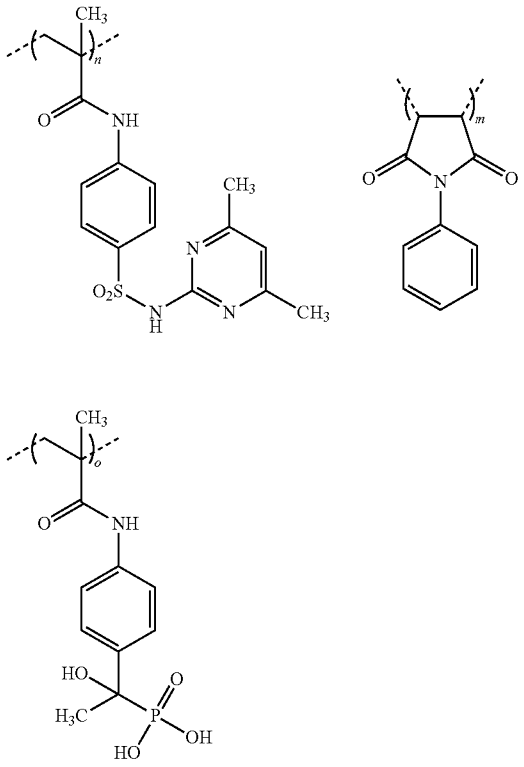

-continued

Resin-14

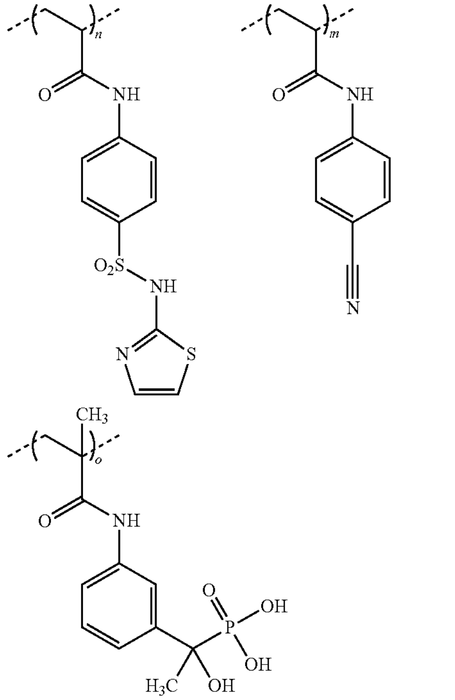

Resin-15

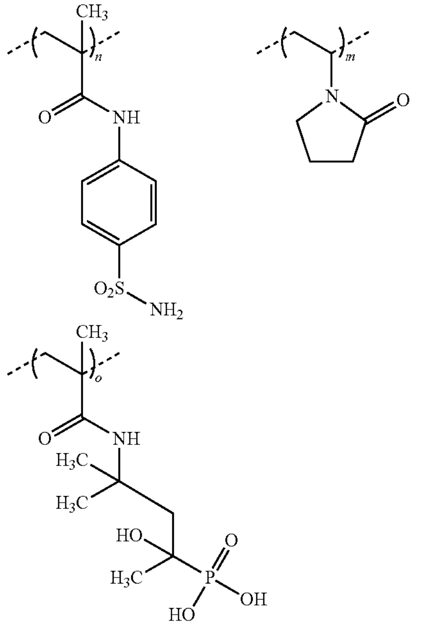

The coating may comprise more than one layer. Preferably, the coating comprises at least two layers; a first layer comprising the resin according to the present invention—further referred to as the first layer, and a second layer comprising a phenolic resin located above said first layer—further referred to as the second layer. First layer means that the layer is, compared to the second layer, located closer to the lithographic support. The binder of the present invention present in the first layer may also be present in the second layer but is preferably only present in the first layer. The phenolic resin is an alkaline soluble oleophilic resin. The phenolic resin is preferably selected from a novolac, a resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858.

Examples of suitable phenolic resins are ALNOVOL SPN452, ALNOVOL SPN400 and ALNOVOL HPN100 (all commercial available from CLARIANT GmbH); DURITE PD443, DURITE SD423A and DURITE SD126A (all commercial available from BORDEN CHEM. INC.); BAKELITE 6866LB02 and BAKELITE 6866LB03 (both commercial available from BAKELITE AG.); KR 400/8 (commercial available from KOYO CHEMICALS INC.); HRJ 1085 and HRJ 2606 (commercially available from SCHNECTADY INTERNATIONAL INC.) and LYNCUR CMM (commercially available from SIBER HEGNER).

The amount of binder according to the present invention in the coating is preferably above 15% wt, more preferably above 20% wt and most preferably above 30% wt relative to the total weight of all ingredients in the coating. Alternatively, the amount of binder according to the present invention is preferably more than 75% wt; more preferably more than 85% wt and most preferably more than 95% wt. In the embodiment where the coating comprises two layers, the resin according to the present invention is preferably present in the coating in an amount comprised between 15% wt and 85% wt, more preferably in an amount between 20% wt and 75% wt and most preferably between 30% wt and 65% wt.

The dissolution behavior of the two-layer coating—i.e. the coating comprising the first layer, the second layer and/or optional other layer—in the developer can be fine-tuned by optional solubility regulating components. More particularly, development accelerators and development inhibitors can be used. These ingredients are preferably added to the second layer.

Development accelerators are compounds which act as dissolution promoters because they are capable of increasing the dissolution rate of the coating. Developer resistance means, also called development inhibitors, are compounds which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP 823 327 and WO 97/39894 are believed to act as dissolution inhibitors due to interaction, e.g. by hydrogen bridge formation, with the alkali-soluble resin(s) in the coating. Inhibitors of this type typically comprise at least one hydrogen bridge forming group such as nitrogen atoms, onium groups, carbonyl (—CO—), sulfinyl (—SO—) or sulfonyl (—$SO_2$—) groups and a large hydrophobic moiety such as one or more aromatic rings. Some of the compounds mentioned below, e.g. infrared dyes such as cyanines and contrast dyes such as quaternized triarylmethane dyes can also act as a dissolution inhibitor.

Other suitable inhibitors improve the developer resistance because they delay the penetration of the aqueous alkaline developer into the coating. Such compounds can be present in the imaging layer and/or in an optional second layer as described in e.g. EP 950 518, and/or in an optional development barrier layer on top of said layer as described in e.g. EP 864 420, EP 950 517, WO 99/21725 and WO 01/45958.

In the latter embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include (i) polymeric materials which are insoluble in or impenetrable by the developer, (ii) bifunctional compounds such as surfactants comprising a polar group and a hydrophobic group such as a long chain hydrocarbon group, a poly- or oligosiloxane and/or a perfluorinated hydrocarbon Group such as Megafac F-177, a perfluorinated surfactant available from Dainippon Ink & Chemicals, Inc., (iii) bifunctional block-copolymers comprising a polar block such as a poly- or oligo(alkylene oxide) and a hydrophobic block such as a long chain hydrocarbon group, a poly- or oligosiloxane and/or a perfluorinated hydrocarbon group such as Tego Glide 410, Tego Wet 265, Tego Protect 5001 or Silikophen P50/X, all commercially available from Tego Chemie, Essen, Germany.

The coating of the heat-sensitive printing plate precursors described above also contains an infrared light absorbing dye or pigment which may be present in the first layer, the second layer and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

IR-1

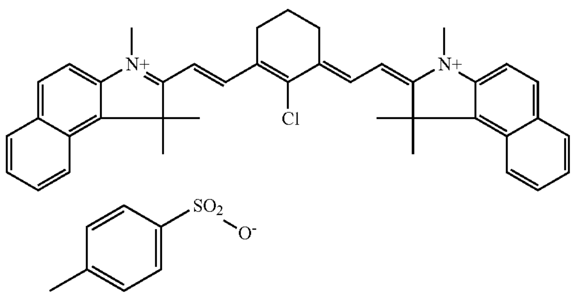

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400, 706 are suitable contrast dyes. Dyes which, combined with specific additives, only slightly color the coating but which become intensively colored after exposure, as described in for example WO2006/005688 may also be used as colorants.

Optionally, the coating may further contain additional ingredients. These ingredients may be present in the first, second or in an optional other layer. For example, polymer particles such as matting agents and spacers, surfactants such as perfluoro-surfactants, silicon or titanium dioxide particles, colorants, metal complexing agents are well-known components of lithographic coatings.

To protect the surface of the coating, in particular from mechanical damage, a protective layer may optionally be applied on top of the coating. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose. The protective layer may contain small amounts, i.e. less then 5% by weight, of organic solvents. The thickness of the protective layer is not particularly limited but preferably is up to 5.0 μm, more preferably from 0.05 to 3.0 μm, particularly preferably from 0.10 to 1.0 μm.

The coating may further contain other additional layer(s) such as for example an adhesion-improving layer located between the first layer and the support.

The lithographic printing plate used in the present invention comprises a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 μm. The aluminum substrate of the current invention has preferably an Ra value below 0.45 μm, more preferably below 0.40 μm, even more preferably below 0.30 μm and most preferably below 0.25 μm. The lower limit of the Ra value is preferably about 0.1 μm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight ($g/m^2$ $Al_2O_3$ formed on the aluminium surface) varies between 1 and 8 $g/m^2$. The anodic weight is preferably $\geq 3$ $g/m^2$, more preferably $\geq 3.5$ $g/m^2$ and most preferably $\geq 4.0$ $g/m^2$.

The grained and anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from Ciba Speciality Chemicals.

The binder according to the present invention may be included in the above described solutions suitable for post-anodic treatment of the support.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in e.g. EP-A 1 025 992.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The heat-sensitive plate precursor can be image-wise exposed directly with heat, e.g. by means of a thermal head, or indirectly by infrared light, preferably near infrared light. The infrared light is preferably converted into heat by an IR light absorbing compound as discussed above. The printing plate precursor is positive working and relies on heat-induced solubilization of the binder of the present invention. The binder is preferably a polymer that is soluble in an aqueous developer, more preferably an aqueous alkaline developing solution with a pH between 7.5 and 14.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD platesetters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known platesetters can be used as an off-press exposure apparatus, which offers the benefit of reduced press down-time. XTD platesetter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

Preferred lithographic printing plate precursors according to the present invention produce a useful lithographic image upon image-wise exposure with IR-light having an energy density, measured at the surface of said precursor, of 200 $mJ/cm^2$ or less, more preferably of 180 $mJ/cm^2$ or less, most preferably of 160 $mJ/cm^2$ or less. With a useful lithographic image on the printing plate, 2% dots (at 200 lpi) are perfectly visible on at least 1000 prints on paper.

The printing plate precursor, after exposure, is developed off-press by means of a suitable processing liquid. In the development step, the exposed areas of the image-recording layer are at least partially removed without essentially removing the non-exposed areas, i.e. without affecting the exposed areas to an extent that renders the ink-acceptance of the exposed areas unacceptable. The processing liquid can be applied to the plate e.g. by rubbing with an impregnated pad, by dipping, immersing, (spin-)coating, spraying, pouring-on, either by hand or in an automatic processing apparatus. The treatment with a processing liquid may be combined with mechanical rubbing, e.g. by a rotating brush. The developed plate precursor can, if required, be post-treated with rinse water, a suitable correcting agent or preservative as known in the art. During the development step, any water-soluble protective layer present is preferably also removed. The development is preferably carried out at temperatures of from 20 to 40° C. in automated processing units as customary in the art. More details concerning the development step can be found in for example EP 1 614 538, EP 1 614 539, EP 1 614 540 and WO/2004/071767.

The developing solution preferably contains a buffer such as for example a silicate-based buffer or a phosphate buffer. The concentration of the buffer in the developer preferably ranges between 3 to 14% wt. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution comprising sodium or potassium metasilicate, i.e. a silicate where the ratio of silicon dioxide to alkali metal oxide is 1.

The developing solution may optionally contain further components as known in the art: other buffer substances, chelating agents, surfactants, complexes, inorganic salts, inorganic alkaline agents, organic alkaline agents, antifoaming agents, organic solvents in small amounts i.e. preferably less than 10% wt and more preferably less than 5% wt, nonreducing sugars, glycosides, dyes and/or hydrotropic agents. These components may be used alone or in combination.

To ensure a stable processing with the developer solution for a prolonged time, it is particularly important to control the concentration of the ingredients in the developer. Therefore a replenishing solution, hereinafter also referred to as replenisher, is often added to the developing solution. More than one replenishing solution containing different ingredients and/or different amounts of the ingredients may be added to the developing solution. Alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. It is advantageous that the (co)polymer of the present invention is present in the replenisher(s); preferably at a concentration of at least 0.5 g/l, more preferably in a concentration ranging between 1 and 50 g/l most preferably between 2 and 30 g/l.

The replenishing solution has preferably a pH value of at least 10, more preferably of at least 11, most preferably of at least 12.

The development step may be followed by a rinsing step and/or a gumming step. A suitable gum solution which can be used is described in for example EP-A 1 342 568 and WO 2005/111727.

To increase the resistance of the finished printing plate and hence to extend its press-life capability (run length), the plate coating is preferably briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 300° C. for a period of 15 seconds to 5 minutes. In a preferred embodiment, the baking temperature does not exceed 300° C. during the baking period. Baking can be done in conventional hot air ovens or by irradiation with lamps emitting in the infrared or ultra-violet spectrum, as e.g. described in EP 1 588 220 and EP 1 916 101. Both so-called static and dynamic baking ovens can be used. As a result of this baking step, the resistance of the printing plate to plate cleaners, correction agents and UV-curable printing inks increases. Such a thermal post-treatment is known in the art and is described, inter alia, in DE 1 447 963, GB 1 154 749 and EP 1 506 854.

According to the present invention there is also provided a method for making a positive-working lithographic printing plate comprising the steps of imagewise exposing the heat-sensitive lithographic printing plate precursor according to the present invention to heat and/or infrared light, followed by developing the imagewise exposed precursor with an aqueous alkaline developer so that the exposed areas are dissolved. The obtained precursor may optionally be baked.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

Table 1 summarizes examples of binders according to the present invention (Polymer-01 to Polymer-23). The initiation temperature used during their synthesis and the resulting molecular weights $M_n$, $M_w$ and $M_w/M_n$ are given in Table 2.

TABLE 1

Examples of binders according to the present invention.

| | Monomer 1 | Monomer 2 | Monomer 3 |
|---|---|---|---|
| Polymer-01 | 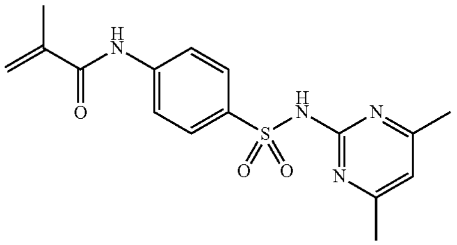 14.5 g | 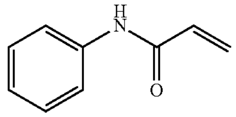 3.6 g | 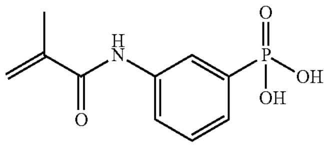 0.84 g |

TABLE 1-continued
Examples of binders according to the present invention.
| | Monomer 1 | Monomer 2 | Monomer 3 |
|---|---|---|---|
| Polymer-02 | 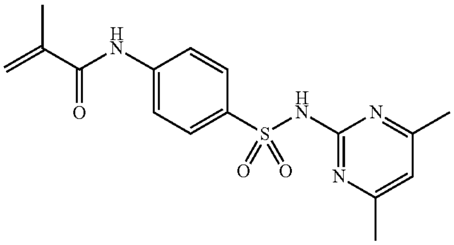 13.3 g | 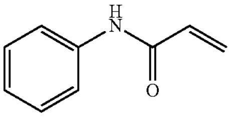 3.6 g | 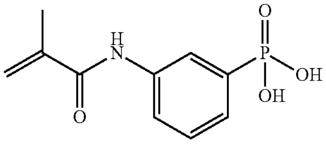 1.7 g |
| Polymer-03 | 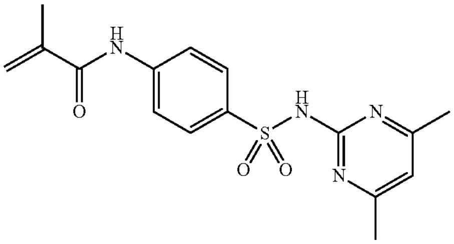 139.4 g | 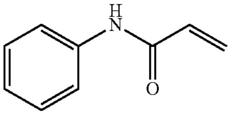 36.1 g | 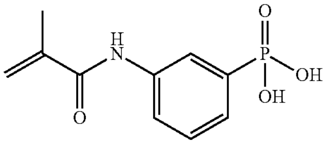 12.7 g |
| Polymer-04 | 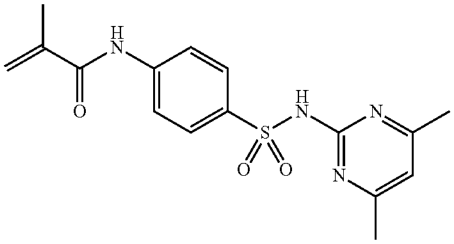 14.1 g | 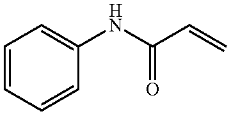 4.1 g | 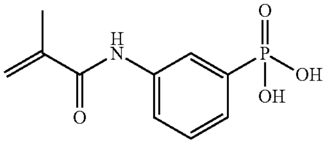 0.34 g |
| Polymer-05 | 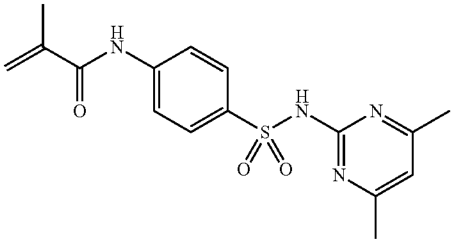 13.6 g | 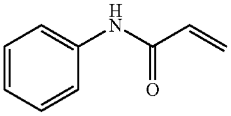 4.1 g | 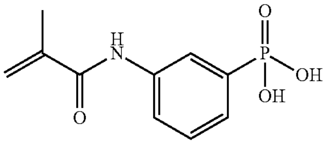 0.67 g |
| Polymer-06 | 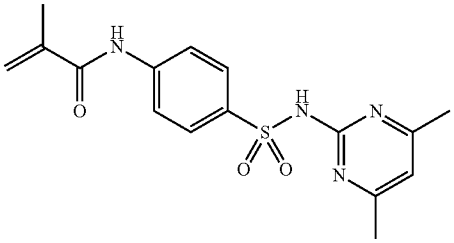 13.1 g | 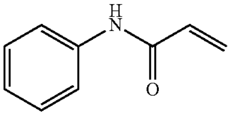 4.1 g | 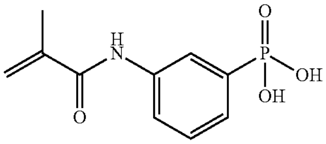 1.01 g |

TABLE 1-continued
Examples of binders according to the present invention.
| | Monomer 1 | Monomer 2 | Monomer 3 |
|---|---|---|---|
| Polymer-07 | 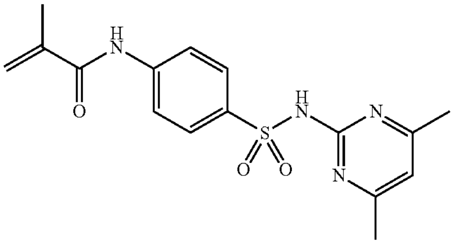 12.1 g | 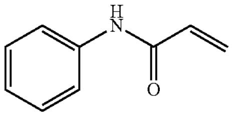 4.1 g | 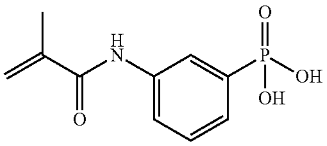 1.69 g |
| Polymer-08 | 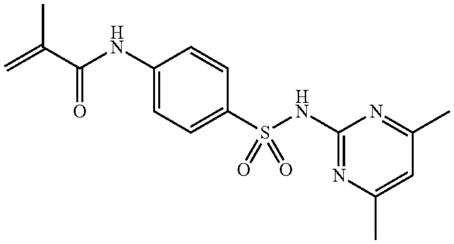 10.9 g | 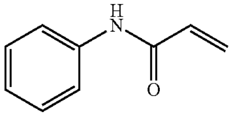 4.1 g | 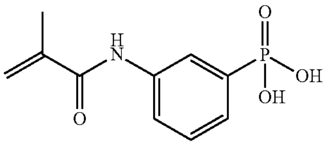 2.53 g |
| Polymer-09 | 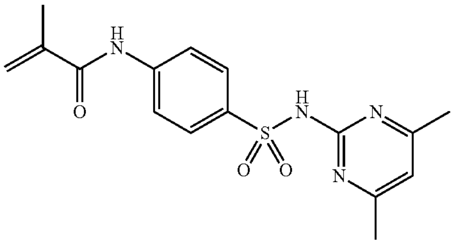 15.8 g | 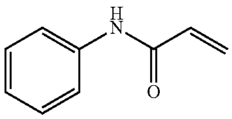 3.6 g | 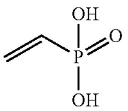 0.38 g |
| Polymer-10 | 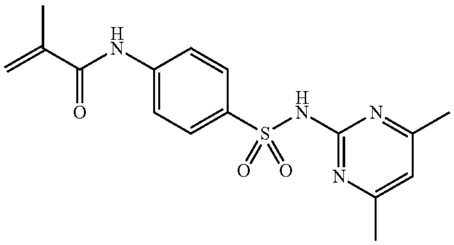 13.9 g | 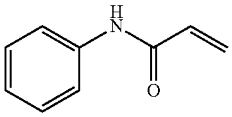 3.6 g | 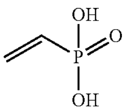 0.56 g |
| Polymer-11 | 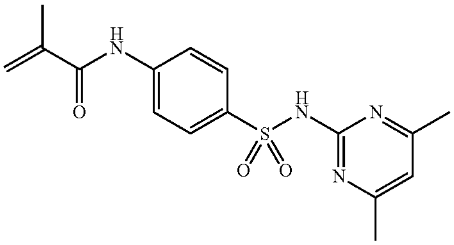 12.1 g | 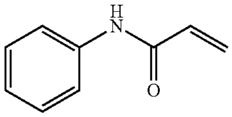 4.1 g | 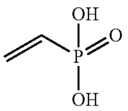 0.76 g |

TABLE 1-continued
Examples of binders according to the present invention.
| | Monomer 1 | Monomer 2 | Monomer 3 |
|---|---|---|---|
| Polymer-12 | 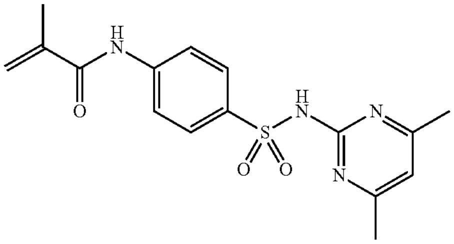 10.9 g | 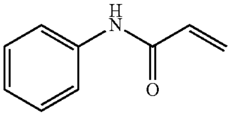 4.6 g | 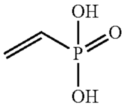 0.76 g |
| Polymer-13 | 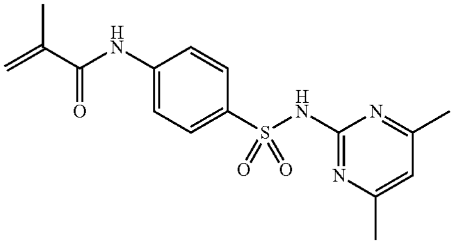 12.6 g | 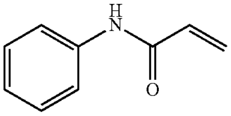 4.1 g | 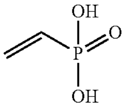 0.6 g |
| Polymer-14 | 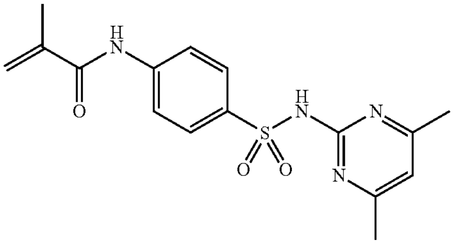 10.9 g | 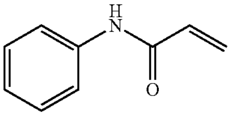 4.6 g | 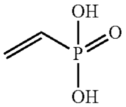 0.76 g |
| Polymer-15 | 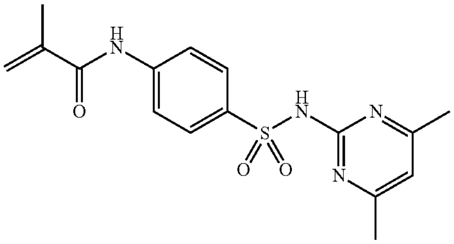 14.1 g | 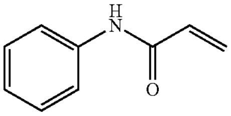 4.1 g | 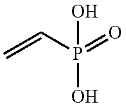 0.15 g |
| Polymer-16 | 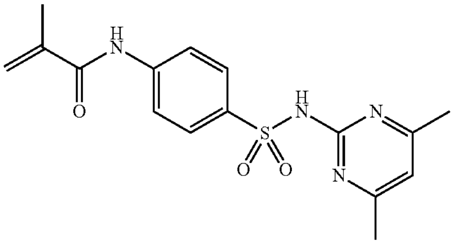 13.6 g | 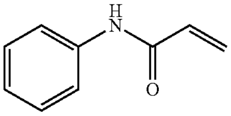 4.1 g | 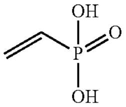 0.3 g |

TABLE 1-continued
Examples of binders according to the present invention.
| | Monomer 1 | Monomer 2 | Monomer 3 |
|---|---|---|---|
| Polymer-17 | 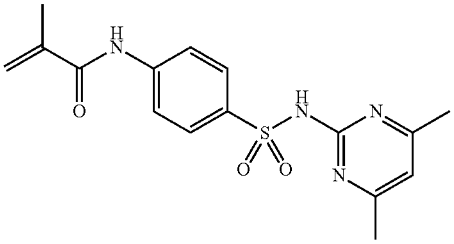 13.1 g | 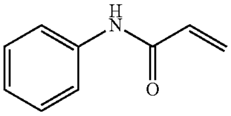 4.1 g | 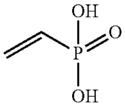 0.45 g |
| Polymer-18 | 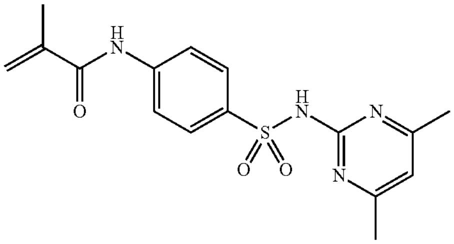 10.9 g | 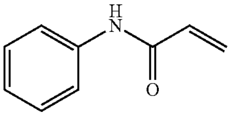 4.1 g | 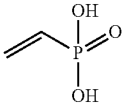 1.1 g |
| Polymer-19 | 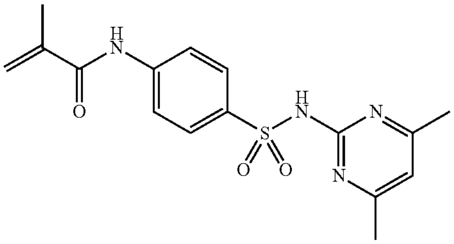 9.7 g | 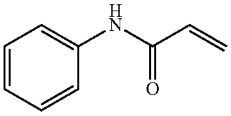 4.1 g | 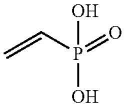 1.5 g |
| Polymer-20 | 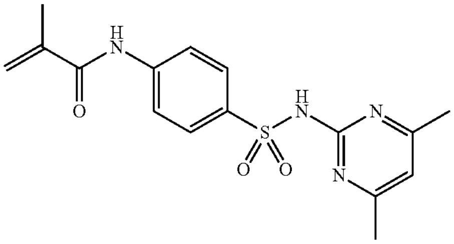 8.5 g | 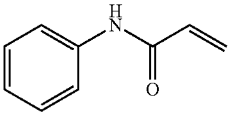 4.1 g | 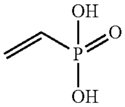 1.9 g |
| Polymer-21 | 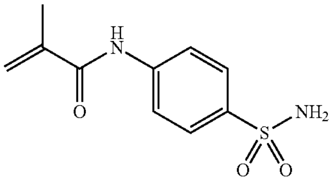 10.5 g | 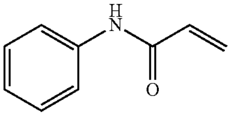 3.6 g | 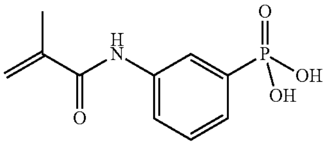 0.41 g |

TABLE 1-continued

| Examples of binders according to the present invention. | | | |
|---|---|---|---|
| | Monomer 1 | Monomer 2 | Monomer 3 |
| Polymer-22 | 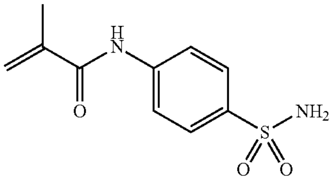 10.1 g | 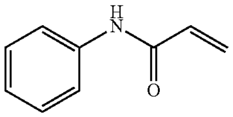 3.6 g | 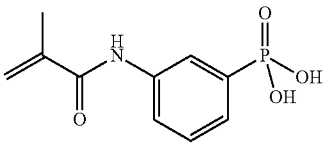 0.84 g |
| Polymer-23 | 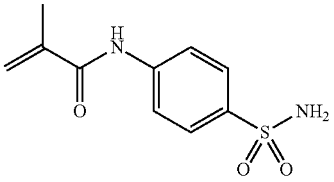 9.7 g | 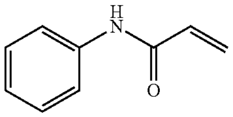 3.6 g | 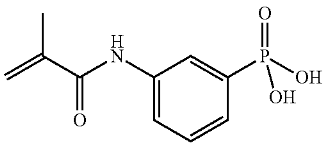 1.25 g |

TABLE 2

Initiation temperatures, $M_n$, $M_w$ and $M_w/M_n$ values of the binders according to the present invention.

| | Initiation temperature | $M_n$ | $M_w$ | $M_w/M_n$ |
|---|---|---|---|---|
| Polymer-01 | 110 | 45246 | 151029 | 3.34 |
| Polymer-02 | 110 | 34746 | 125172 | 3.60 |
| Polymer-03 | 96.3 | 38458 | 143638 | 3.73 |
| Polymer-04 | 100.2 | 57592 | 192503 | 3.34 |
| Polymer-05 | 100.7 | 46278 | 148087 | 3.20 |
| Polymer-06 | 100.9 | 47968 | 170635 | 3.56 |
| Polymer-07 | 101.4 | 52381 | 246624 | 4.71 |
| Polymer-08 | 103.2 | 42368 | 212353 | 5.01 |
| Polymer-09 | 99.6 | 53192 | 238080 | 4.48 |
| Polymer-10 | 99.7 | 40288 | 160370 | 3.98 |
| Polymer-11 | 98.6 | 37630 | 115735 | 3.08 |
| Polymer-12 | 99.3 | 33871 | 111272 | 3.29 |
| Polymer-13 | 101 | 38975 | 143653 | 3.68 |
| Polymer-14 | 100.5 | 41312 | 142469 | 3.45 |
| Polymer-15 | 98.7 | 52644 | 163300 | 3.10 |
| Polymer-16 | 99.0 | 48912 | 148352 | 3.03 |
| Polymer-17 | 98.9 | 46469 | 165019 | 3.55 |
| Polymer-18 | 99.1 | 36624 | 99022 | 2.70 |
| Polymer-19 | 99.0 | 31996 | 83955 | 2.62 |
| Polymer-20 | 99.7 | 31139 | 70879 | 2.28 |
| Polymer-21 | 115 | 32242 | 77490 | 2.40 |
| Polymer-22 | 110 | 35192 | 72892 | 2.07 |
| Polymer-23 | 110 | 36285 | 83249 | 2.29 |

Synthesis

1. The synthesis of [3-(2-methyl-acryloylamido)-phenyl]-phosphonic acid (PHOS-1)

1) (3-nitro-phenyl)-phosphonic acid

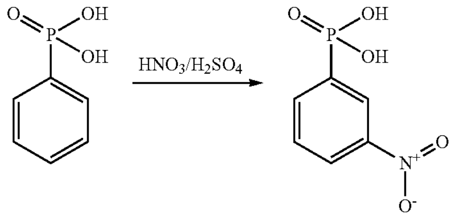 [SMILES: O=P(O)(O)c1ccccc1 ; O=[N+]([O-])c1cccc(P(=O)(O)O)c1]

A solution of phenyl-phosphonic acid (75 g, 0.4744 mol) in sulphuric acid (306 ml) was cooled to 0° C. A mixture of sulphuric acid (30 ml) and nitric acid (65%) (39 ml) was added dropwise over 2.5 hours. The mixture was stirred at 0° C. for 2 hours. The reaction mixture was poured into ice (900 g) and after stirring 1 hour at room temperature, filtration provided 70.0 g of a white solid (m.p. 148-155° C.)

2) (3-amino-phenyl)-phosphonic acid

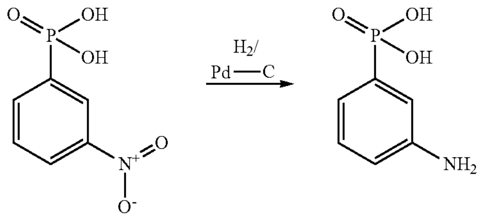

A solution of (3-nitro-phenyl)-phosphonic acid (52.6 g, 0.210 mol) in methanol (110 ml) was hydrogenated at 4 Atm using Pd—C as catalyst (10% Pd). After 4 hours the hydrogenation was complete. (3-amino-phenyl)-phosphonic acid precipitated from the medium, was isolated by filtration and washed several times with methanol. The solid was brought into distilled water (90 ml) and the pH was adjusted to 8 with an aqueous solution of sodium hydroxide (2M) upon which (3-amino-phenyl)-phosphonic acid dissolved. The catalyst was removed by filtration. The pH of the filtrate was adjusted to 3 with acetic acid. (3-amino-phenyl)-phosphonic acid precipitated from the medium and was isolated by filtration, yielding 25.5 g of a solid (m.p. 300° C.)

3) [3-(2-methyl-acryloylamido)-phenyl]-phosphonic acid

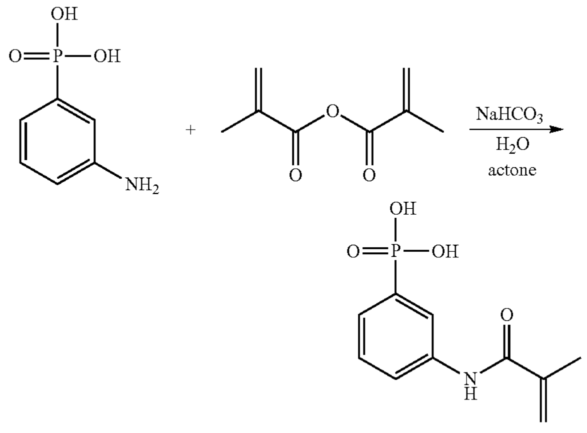

To a suspension of (3-amino-phenyl)-phosphonic acid (34.6 g, 0.2 mol) and 2,6-di-tert-butyl-4-methylphenol (1.3 g, 0.006 mol) in acetone (200 ml), a solution of sodium bicarbonate (21 g, 0.25 mol) in distilled water (340 ml) was added dropwise, which resulted in a clear solution. After 10 minutes, methacrylic anhydride (39.4 g, 0.24 mol) in acetone (140 ml) was added dropwise over 65 minutes. When 140 ml of the solution was added, the reaction mixture changed again in a suspension. Sodium bicarbonate (4.2 g, 0.05 mol) in distilled water (60 ml) was added, resulting in a clear solution. After adding the total amount of the methacrylic anhydride solution, the reaction mixture was allowed to stir for 15 hours.

The solvent was removed under reduced pressure. The residue was brought into a mixture of distilled water and hydrochloric acid (5M) (60 ml) and was extracted with n-butanol. The aqueous layer was separated and extracted with n-butanol. The organic layers were pooled and washed twice with a solution of sodium chloride (25%) and twice with distilled water. The organic layer was isolated and the solvent was removed under reduced pressure. The crude PHOS-1 was suspended into ethyl acetate (100 ml), filtered, washed with methyl-tert-butylether (50 ml) and dried, yielding 45.2 g of a pale yellow solid.

2. The synthesis of [1-(3-acryloylamido-phenyl)-1-hydroxy-ethyl]-phosphoric acid (PHOS-3)

1. N-(3-acetyl-phenyl)-3-chloro-proprionamide

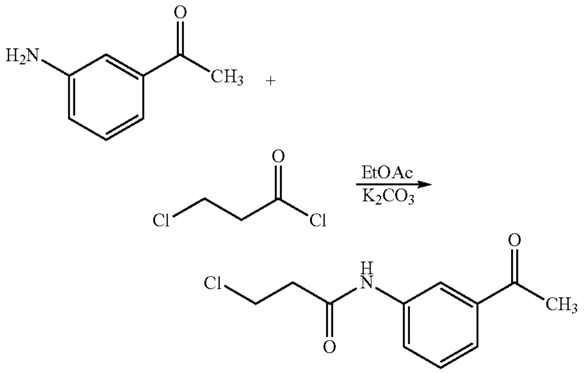

To a mixture of 3-aminoacetophenone (13.5 g, 0.1 mol) in ethyl acetate (90 ml), potassium carbonate (16.6 g, 0.12 mol) in distilled water (40 ml) was added. The reaction mixture was cooled to 0° C. and 3-chloropropionyl chloride (13.3 g, 0.105 mol) was added drop wise over 10 minutes and the reaction mixture was allowed to stir at 0° C. for 30 minutes. The temperature of the reaction mixture was allowed to raise to room temperature and a mixture of ethyl acetate (30 ml) and distilled water (50 ml) was added.

The reaction mixture was allowed to stand at room temperature for 15 hours. The reaction mixture was filtered and the precipitated N-(3-acetyl-phenyl)-3-chloro-proprionamide was washed with ethyl acetate (30 ml) and dried to provide 12.5 g of a white solid. The filtrate (which consisted of an organic layer and an aqueous layer) was brought in a separating funnel and the organic layer was separated and evaporated and reduced pressure. The residue was suspended in methyl-tert-butylether (100 ml), and was stirred for 30 minutes at room temperature. Filtration, washing with methyl-tert-butylether (20 ml) and drying provided 6.3 g of a white solid. Both isolated fractions were pooled.

2. N-(3-Acetyl-phenyl)-acrylamide

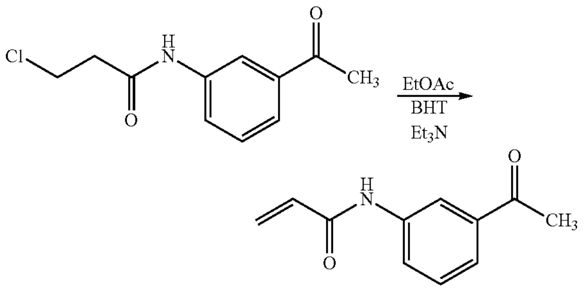

To a solution of N-(3-acetyl-phenyl)-3-chloro-propionamide acid (11.2 g, 0.05 mol) and 2,6-di-tert-butyl-4-methylphenol (0.1 g, 0.0005 mol) in ethyl acetate (75 ml), triethylamine (13.9 g, 0.1 mol) in ethyl acetate (35 ml) was added. The reaction mixture was heated at 73° C. and allowed to stir for 19 hours. The solvent was evaporated under reduced pressure and the residue was brought in a mixture of distilled water (200 ml) and hydrochloric acid (1N) (20 ml) and stirred for 30 minutes at room temperature.

The crude N-(3-acetyl-phenyl)-acrylamide was isolated by filtration and suspended in distilled water (150 ml) and stirred for 30 minutes. Filtration, washing with distilled water (50 ml) and methyl-tert-butylether (50 ml) and drying yielded 6.9 g of N-(3-acetyl-phenyl)-acrylamide as a white solid.

3. [1-(3-acryloylamido-phenyl)-1-hydroxy-ethyl]-phosphonic acid (V250960)

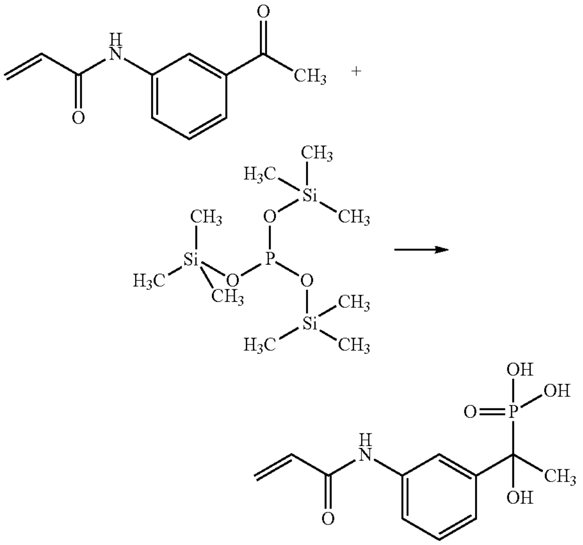

To a solution of N-(3-Acetyl-phenyl)-acrylamide (6.6 g, 0.035 mol) in dichloromethane (100 ml), tris(trimethylsilyl) phosphite (20.9 g, 0.07 mol) was added. The reaction mixture was allowed to stir for about 72 hours at room temperature. 2,6-di-tert-butyl-4-methylphenol (0.07 g, 0.35 mmol) was added and the solvent was evaporated under reduced pressure. The residue was brought in ethanol (200 ml) and distilled water (40 ml) and stirred for 3 hours at room temperature. The solvent was removed under reduced pressure. PHOS-3 was purified on a Chromabond Flash MN180 Column using distilled water as eluent, yielding 4.89 g of PHOS-3 as a white solid 3. The synthesis of (3-Acryloylamido-1-hydroxy-1,3-dimethyl-butyl)-phosphonic-acid (PHOS-10)

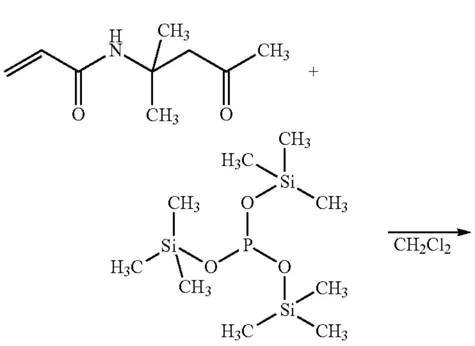

-continued

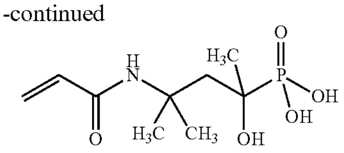

To a clear solution of N-(1,1-dimethyl-3-oxo-butyl)-acrylamide (5.1 g, 0.03 mol) in dichloromethane (60 ml), tris(trimethylsilyl) phosphite (18.5 g, 0.06 mol) was added. The reaction was stirred for 2 hours at room temperature and 19 hours at 37° C. 2,6-di-tert-/5 butyl-4-methylphenol (0.07 g, 0.00035 mol) was added and the solvent was evaporated under reduced pressure. The residue was brought in ethanol (200 ml) and distilled water (40 ml) and stirred for 3 hours at room temperature. Ethanol was removed under reduced pressure. n-butanol (100 ml) was added to the aqueous layer and the mixture was stirred for 1 hour. After separation of the organic layer, the aqueous layer was extracted again with n-butanol (50 ml). The organic layers were pooled and the solvent was evaporated under reduced pressure. The oily residue was washed twice with methyl-tert-butylether (100 ml). The solvent was decanted off and the residue was dried. The oily residue was brought in a mixture of ethanol (40 ml) and distilled water (10 ml) and stirred for 3 hours at room temperature. The solvent was evaporated under reduced pressure. The oily residue was purified on a Chromabond MN180 Column using distilled water as eluent, to yield 1.9 g of PHOS-10 as a white solid.

4. The Synthesis of Polymer-01 and Polymer-02

In a 125 ml reactor, the appropriate amount of sulphonamide according to Table 1, 3.6 g (24.5 mmol) phenylacrylamide, the appropriate amount of monomer 3 according to Table 1 and 35.4 g gamma-butyrolactone were added and the mixture was heated to 140° C., while stirring at 200 rpm. A constant flow of nitrogen was put over the reactor. After dissolution of all the components, the reactor was cooled to 110° C. 80.0 μl Trigonox DC50 was added, followed by the addition of 0.323 ml Trigonox 141 in 0.798 ml butyrolactone. The polymerization was started and the reactor was heated to 140° C. over 2 hours, while dosing 410 μl Trigonox DC50. The mixture was stirred at 400 rpm and the polymerization was allowed to continue for 2 hours at 140° C. The reaction mixture was cooled to 120° C. and the stirrer speed was enhanced to 500 rpm. 19.6 ml 1-methoxy-2-propanol was added and the reaction mixture was allowed to cool down to room temperature. The polymers were analyzed with gel permeation chromatography using dimethyl acetamide/LiCl/acetic acid as eluent (2.1 g LiCl and 6 ml acetic acid per 1 eluent) on a PL-gel MIXED-D column (exclusion limit: 200-400 000), relative to polystyrene standards.

5. The Synthesis of Polymer-03

In a 5 L reactor, 139.4 g (0.4025 mol) sulphonamide, 36.1 g (0.245 mol) phenylacrylamide, 12.7 g (0.0525 mol) monomer 3 and 424 g gamma-butyrolactone were added and the mixture was heated to 140° C., while stirring at 350 rpm. A constant flow of nitrogen was put over the reactor. After dissolution of all the components, the reactor was cooled to 97° C. 3.2 ml Trigonox 141 in 8.0 ml butyrolactone was added followed by the addition of 0.8 ml Trigonox DC50. The polymerization was started and 2 minutes later 4.08 ml Trigonox DC50 was added over 2 minutes. The reactor was heated to 130° C. over 4 hours and the stirrer speed was enhanced to 400 rpm. The reaction mixture was cooled to 120° C. and the stirrer speed was enhanced to 500 rpm. 197 ml 1-methoxy-2-propanol was added and the reaction mixture was allowed to cool down to room temperature. The polymer was analyzed with gel permeation chromatography using dimethyl acetamide/LiCl/acetic acid as eluent (2.1 g LiCl and 6 ml acetic acid per 1 eluent) on a PL-gel MIXED-D column (exclusion limit: 200-400 000), relative to polystyrene standards.

6. The Synthesis of Polymer-04 to Polymer-20

In a 125 ml reactor, the appropriate amount of sulphonamide according to Table 1, 4.1 g (28 mmol) phenylacrylamide, the appropriate amount of monomer 3 according to Table 1 and 42 g gamma-butyrolactone were added and the mixture was heated to 140° C., while stirring at 200 rpm. A constant flow of nitrogen was put over the reactor. After dissolution of all the components, the reactor was cooled to the appropriate initiation temperature, as shown in the table 1. 80.0 μl Trigonox DC50 was added, followed by the addition of 0.3 ml Trigonox 141 in 0.9 ml butyrolactone. The polymerization was started and the reactor was heated to 140° C. over 2 hours, while dosing 410 μl Trigonox DC50. The mixture was stirred at 400 rpm and the polymerization was allowed to continue for 2 hours at 140° C. The reaction mixture was cooled to 120° C. and the stirrer speed was enhanced to 500 rpm. 19.6 ml 1-methoxy-2-propanol was added and the reaction mixture was allowed to cool down to room temperature. The polymers were analyzed with gel permeation chromatography using dimethyl acetamide/LiCl/acetic acid as eluent (2.1 g LiCl and 6 ml acetic acid per 1 eluent) on a PL-gel MIXED-D column (exclusion limit: 200-400 000), relative to polystyrene standards.

7. The Synthesis of Polymer-21 to Polymer-23

In a 125 ml reactor, the appropriate amount of sulphonamide according to Table 1, 3.6 g (24.5 mmol) phenylacrylamide, the appropriate amount of monomer 3 according to Table 1 and 42 g gamma-butyrolactone were added and the mixture was heated to 140° C., while stirring at 200 rpm. A constant flow of nitrogen was put over the reactor. After dissolution of all the components, the reactor was cooled to the appropriate initiation temperature, as shown in the Table 1. 80.0 μl Trigonox DC50 was added, followed by the addition of 0.3 ml Trigonox 141 in 0.9 ml butyrolactone. The polymerization was started and the reactor was heated to 140° C. over 2 hours, while dosing 410 μl Trigonox DC50. The mixture was stirred at 400 rpm and the polymerization was allowed to continue for 2 hours at 140° C. The reaction mixture was cooled to 120° C. and the stirrer speed was enhanced to 500 rpm. 19.6 ml 1-methoxy-2-propanol was added and the reaction mixture was allowed to cool down to room temperature. The polymers were analyzed with gel permeation chromatography using dimethyl acetamide/LiCl/acetic acid as eluent (2.1 g LiCl and 6 ml acetic acid per 1 eluent) on a PL-gel MIXED-D column (exclusion limit: 200-400 000), relative to polystyrene standards.

8. Comparative Polymers Including Monomers with Phosphate Groups

The modus operandi as given for the synthesis of Polymer-21 to Polymer-23 above was followed. The appropriate amount of the Monomers 1, 2 and 3 are indicated in the Table below.

The polymerisation of monomers including phosphate based monomers immediately lead to gel formation, even at relative low amounts of phosphate monomers.

| Monomer 1 | Monomer 2 | Monomer 3* | Initiation temperature | |
|---|---|---|---|---|
| 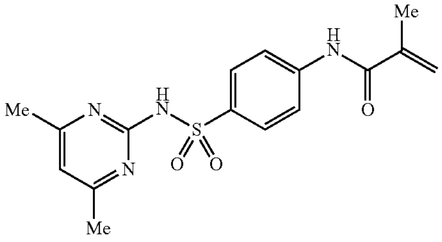 (35) 8.5 g | 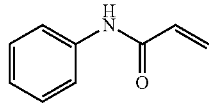 (40) 4.1 | 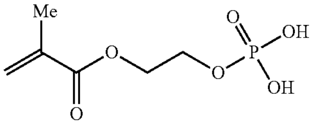 (6) 0.93 g | 100 | Gel formation in the reaction mixture immediately upon initiation |
| 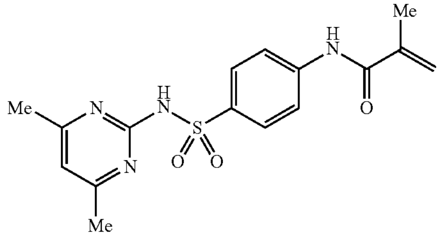 (48) 11.8 | 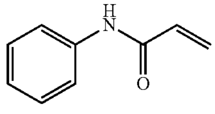 (40) 4.1 | 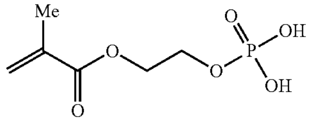 (12) 1.86 g | — | Spontaneous gel formation just before initiation |

*Genorad 40, supplied by Rahn A.G.

Preparation of the Lithographic Support S-01.

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 $A/dm^2$ (charge density of about 80° $C./dm^2$). Afterwards, the aluminium foil was desmutted by etching with an aqueous solution containing 145 g/l of sulfuric acid at 80° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and a current density of 33 $A/dm^2$ (charge density of 330 $C/dm^2$), then washed with demineralised water for 7 seconds and dried at 120° C. for 7 seconds.

The support thus obtained was characterised by a surface roughness Ra of 0.35-0.4 μm (measured with interferometer NT1100) and an anodic weight of 4.0 $g/m^2$.

Example 1

1.1 Preparation of Printing Plate Precursors PPP-01 to PPP-11

1. First Coating Layer

A first coating solution (Table 3) was applied on the aluminium substrate AS-01 at a wet coating thickness of 20 μm. After coating, this first layer was dried at 115° C. for 3 minutes.

TABLE 3

| first coating solution. | |
|---|---|
| Composition coating solution | g |
| Dowanol PM (1) | 212.53 |
| THF | 589.25 |
| Binder-01 to Binder-11 (2) | 138.18 |
| Crystal Violet (3) | 54.40 |
| Tegoglide 410 (4) | 5.64 |

(1) Propyleneglycol-monomethylether (1-methoxy-2-propanol) from Dow Chemical Company.
(2) 24 wt % solutions in a mixture of Dowanol PM/buyrolactone (71/29) of the following binders:
PPP-01: Binder-01 (comparative binder):

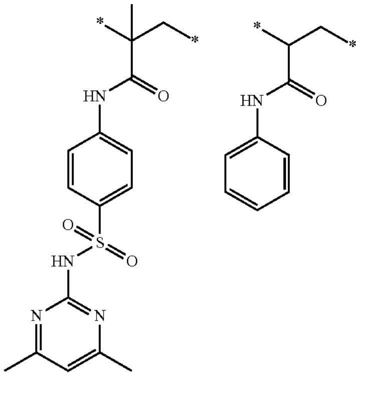

(65 mol %) (35 mol %)

PPP-02: Binder-02 = Polymer-15 (see Table 1);
PPP-03: Binder-03 = Polymer-16 (see Table 1);
PPP-04: Binder-04 = Polymer-17 (see Table 1);
PPP-05: Binder-05 = Polymer-13 (see Table 1);
PPP-06: Binder-06 = Polymer-11 (see Table 1);

TABLE 3-continued

| first coating solution. | |
|---|---|
| Composition coating solution | g |

PPP-07: Binder-07 = Polymer-12 (see Table 1);
PPP-08: Binder-08 = Polymer-14 (see Table 1);
PPP-09: Binder-09 = Polymer-18 (see Table 1);
PPP-10: Binder-10 = Polymer-19 (see Table 1);
PPP-11: Binder-11 = Polymer-20 (see Table 1).
(3) 1 wt % solution of Crystal Violet in Dowanol PM. Crystal Violet is commercially available from Ciba-Geigy GmbH.
(4) 1 wt % solution of Tegoglide 410 in Dowanol PM. Tegoglide 410 is a copolymer of polysiloxane and poly(alkylene oxide), commercially available from Tego Chemie Service GmbH.

The total dry coating weight amounted to 598.6 $mg/m^2$. The dry weight of the ingredients is shown in Table 4.

TABLE 4

| Dry coating weight of the first layer. | |
|---|---|
| Dry Weight First Coating | $mg/m^2$ |
| Binder-01 to Binder-11 | 588 |
| Crystal Violet (1) | 9.6 |
| Tegoglide 410 (2) | 1.0 |

(1) and (2): see Table 3.

2. Second Coating Solution

A second coating solution (Table 5) was subsequently coated on the previous layer (wet coating thickness=16 μm) resulting in printing plate precursors PPP-01 to PPP-11. After coating, this second layer was dried at 135° C. for 3 minutes.

TABLE 5

| Second coating solution. | |
|---|---|
| Composition coating solution | g |
| Dowanol PM (1) | 300.86 |
| MEK | 473.27 |
| Alnovol SPN402 (44.3 wt %) (2) | 105.77 |
| TMCA (10 wt %) (3) | 39.91 |
| Adagio (4) | 1.78 |
| Crystal Violet (1 wt %) (5) | 71.27 |

(1) see Table 3;
(2) Alnovol SPN402 is a 44.3% wt. solution of novolac resin in Dowanol PM. from Clariant GmbH;
(3) 10 wt % solution of TMCA in Dowanol PM., TMCA is 3,4,5-trimethoxy cinnamic acid;
(4) Adagio is an IR absorbing cyanine dye, commercially available from FEW CHEMICALS, with the chemical structure IR-1 (see above);
(5) 1% wt solution of Crystal Violet in Dowanol PM. Crystal Violet is commercially available from Ciba-Geigy GmbH.

The total dry coating weight amounted to 701.6 $mg/m^2$. The dry weight of the ingredients is shown in Table 6.

TABLE 6

| Dry coating weight of the second layer. | |
|---|---|
| Dry Weight second coating | $mg/m^2$ |
| Alnovol SPN402 (1) | 607.5 |
| TMCA (2) | 57.3 |
| Adagio (3) | 25.6 |
| Crystal Violet (4) | 10.2 |
| Tegoglide 410 (5) | 1.0 |

(1), (2), (3), (4): see Table 5;
(5): see Table 3.

1.2 Results

Evaluation of the Sensitivity, Stain Resistance and Development Latitude of the Printing Plate Precursors.

The printing plate precursors PPP-01 to PPP-11 were imaged on a Creo TrendSetter with a 20 W imaging head (commercially available from Kodak) at 140 rpm and 2400 dpi and then developed in an Agfa Autolith TP105 processor (commercially available from Agfa Graphics) with Agfa Energy Elite Improved Developer (commercially availailable from Agfa) in the developer section and tap water at room temperature in the finisher section. The processing conditions were: 25° C. developer temperature and 22 seconds developer dwell time.

The "right exposure" (RE) sensitivity is the energy density value (mJ/$cm^2$) at which the 1×1 checkerboard pattern on the plate after processing has the same density as the 8×8 checkerboard pattern. The density was measured with a Gretag-MacBeth D19C densitometer, commercially available from GretagMacbeth AG. The automatic colour filter setting was used.

The density of the non-image areas ($D_{min}$) of the plate precursors after imaging at the right exposure (RE) and processing was determined and is a measure of the stain resistance of the plate. The density is measured using a Gretag-MacBeth DC19 densitometer (commercially available from GretagMacbeth AG, cyan filter setting, zeroed on a non-coated piece of aluminium substrate AS-01). A $D_{min}$ value higher than 0.05 is unacceptable.

Finally, the development latitude of the printing plate precursors PPP-01 to PPP-11 was evaluated by changing the developer dwell time from 18 seconds to 26 seconds (22 sec.±4 sec.) and monitoring the according tone value change of the 1×1 checkerboard pattern on the plate (Gretag-MacBeth D19C densitometer, commercially available from GretagMacbeth AG, zeroed on a non-coated piece of aluminium substrate AS-01). A tone value change higher than 5% is not acceptable.

TABLE 7

Sensitivity, stain resistance and development latitude.

| Printing Plate Precursor | Binder | Mol % phosphonic acid containing monomer | "RE" Sensitivity (mJ/$cm^2$) | $D_{min}$* | Development latitude** (%) |
|---|---|---|---|---|---|
| PPP-01, comp. | Binder-01 | 0 | 148 | 0.12 | 4 |
| PPP-02, inv. | Binder-02 | 2 | 174 | 0.02 | 3 |
| PPP-03, inv. | Binder-03 | 4 | 184 | 0.015 | 2 |
| PPP-04, inv. | Binder-04 | 6 | 171 | 0.005 | 3 |
| PPP-05, inv. | Binder-05 | 8 | 171 | 0.01 | 3 |
| PPP-06, inv. | Binder-06 | 10 | 155 | 0.02 | 4 |
| PPP-07, inv. | Binder-07 | 10 | 186 | 0.01 | 2 |
| PPP-08, inv. | Binder-08 | 12 | 188 | 0.01 | 2 |
| PPP-09, inv. | Binder-09 | 15 | 142 | 0.02 | 5 |
| PPP-10, comp. | Binder-10 | 20 | 84 | 0.02 | 26 |
| PPP-11, comp. | Binder-11 | 25 | 20 | 0.015 | n.a.*** |

*$D_{min}$ as a measure of stain; a $D_{min}$ value higher than 0.05 is unacceptable;

**change of the tone value; a value above 5% is unacceptable;

***n.a. = not assessable; value is too high.

Evaluation of the Plate Precursors Resistance to Pressroom Chemicals.

All of the printing plate precursors PPP-01 to PPP-11 were imaged at the right exposure "RE" and developed as outlined above and subsequently the image parts of the press-ready plates were exposed to the different pressroom chemicals for 3 minutes as follows: a drop of 50 μl. of these chemicals was dispensed onto several image parts of the plate and subsequently wiped off with a cotton pad; the plate subsequently was washed with tap water and left to dry. The pressroom chemicals used in this test and the results of this test are given in Table 8.

TABLE 8

Chemical resistance.

| Printing Plate Precursor | Binder used | Mol % phosphonic acid containing monomer | Chemical resistance* (a) | (b) | (c) | (d) |
|---|---|---|---|---|---|---|
| PPP-01, comp. | Binder-01 | 0 | 1 | 1 | 2 | 1 |
| PPP-02, inv. | Binder-15 | 2 | 1 | 1 | 2 | 1 |
| PPP-03, inv. | Binder-16 | 4 | 1 | 2 | 2 | 1 |
| PPP-04, inv. | Binder-17 | 6 | 1 | 2 | 2 | 1 |
| PPP-05, inv. | Binder-13 | 8 | 1 | 2 | 1 | 1 |
| PPP-06, inv. | Binder-11 | 10 | 1 | 2 | 2 | 1 |
| PPP-07, inv. | Binder-12 | 10 | 1 | 1 | 2 | 1 |
| PPP-08, inv. | Binder-14 | 12 | 1 | 2 | 1 | 1 |
| PPP-09, inv. | Binder-18 | 15 | 1 | 2 | 2 | 1 |
| PPP-10, comp. | Binder-19 | 20 | 1 | 2 | 2 | 2 |
| PPP-11, comp. | Binder-20 | 25 | 1 | 2 | 2 | 2 |

*chemical resistance of the image parts with regards to: (a) isopropanol; (b) Prisco 2351, a fountain solution additive commercially available from Printers' Service Inc. (Newark NJ, USA); (c) Fortakleen Ultra, a plate cleaner commercially available from Agfa Graphics; and (d) Allied Meter X, a press wash commercially available from Allied Pressroom Chemistry Inc. (Hollywood FL, USA).

The following scale was used to evaluate a plate's resistance to the used pressroom chemicals:

0=no visual effect (i.e. the drop contact zone is visually identical to the rest of the plate);

1=only the outer rim of the drop contact zone shows signs of discoloration;

2=a slight loss of coating can be witnessed within the drop contact zone (evidenced by a slight discoloration of the coating);

3=a clear coating loss can be witnessed within the drop contact zone;

4=complete coating loss (i.e. the plate substrate is visible).

The results in Tables 7 and 8 show that printing plate precursors comprising a binder comprising a monomeric unit comprising a sulfonamide group and a monomeric unit comprising a phosphonic acid in an amount ranging between 2 mol % and 15 mol % of the total monomer composition result in printing plates with an acceptable $D_{min}$ after imaging and development (i.e. no stain in the non-image areas) while at the same time the resistance to press chemicals is maintained (press-ready plate). Furthermore, the development latitude of these plate precursors is largely sufficient.

When less than 2 mol % of phosphonic acid comprising monomer is present, a non-acceptable stain occurs in the non-image areas after imaging and development. When 20 mol % or more of phosphonic acid comprising monomer is present, a printing plate precursor is obtained with an insufficient development latitude.

Example 2

2.1 Preparation of Printing Plate Precursors PPP-12 to PPP-17

The printing plate precursors PPP-12 to PPP-17 were prepared in the same way as the printing plate precursors PPP-01 to PPP-11 as described above in Example 1.

2.2 Results

The evaluation of "right exposure" (RE) sensitivity and the density of the non-image areas ($D_{min}$) of the plate was performed in the same way as described in Example 1. The results are given in Table 9.

TABLE 9

Sensitivity, stain resistance and development latitude.

| Printing Plate Precursor | Binder* | Mol % phosphonic acid containing monomer | "RE" Sensitivity ($mJ/cm^2$) | $D_{min}$** |
|---|---|---|---|---|
| PPP-12, comp. | Binder-01 | 0 | 152 | 0.12 |
| PPP-13, inv. | Binder-12 | 2 | 177 | 0.02 |
| PPP-14, inv. | Binder-13 | 4 | 155 | 0.01 |
| PPP-15, inv. | Binder-14 | 6 | 174 | 0.01 |
| PPP-16, inv. | Binder-15 | 10 | 145 | 0.015 |
| PPP-17, inv. | Binder-16 | 15 | 137 | 0.01 |

*PPP-12 Binder-01 (see Table 3); PPP-13 Binder-12 = Polymer-4 (see Table 1); PPP-14 Binder-13 = Polymer-5 (see Table 1); PPP-15 Binder-14 = Polymer-6 (see Table 1); PPP-16 Binder-15 = Polymer-7 (see Table 1); PPP-17 Binder-16 = Polymer-8 (see Table 1);
**$D_{min}$ as a measure of stain, a $D_{min}$ value higher than 0.05 is unacceptable.

The results show that a printing plate precursor comprising a binder including a monomer having less than 2 mol % of phosphonic acid results in non-acceptable staining in the non-image areas.

Example 3

The printing plate precursors PPP-01 and PPP-06 were imaged at the "right exposure" (RE) on a Creo TrendSetter with a 20 W imaging head (commercially available from Kodak) at 140 rpm and 2400 dpi and then developed in an Agfa Autolith TP105 processor (commercially available from Agfa Graphics) with Agfa Energy Elite Improved Developer (commercially availailable from Agfa) in the developer section and tap water at room temperature in the finisher section (processing conditions: 25° C. developer temperature and 22 seconds developer dwell time). Subsequently, the resulting printing plates were cut to the correct size to allow them to be mounted side-by-side on a Drent Gazelle F480 one-color web press equipped with a UV dryer (commercially available from Drent). Subsequently UV printing was performed on uncoated paper, using Janecke & Schneemann Supra UV to Magenta 568 001 as ink (commercially available from Jänecke & Schneemann) and 2.5% Prima FS707WEB (commercially available from Agfa Graphics N.V.)+10% isopropyl alcohol as fountain solution. A MacDermid Graffity blanket (commercially available from MacDermid) was used.

The "useful press life" of each printing plate was evaluated by monitoring every 10.000 impressions the rendition (density) on the printed sheet of a test pattern with a nominal tone value of 40% (200 lpi ABS (Agfa Balanced Screening)) using a Gretag-MacBeth D19C (commercially available from GretagMacbeth AG, magenta filter setting). The "useful presslife" of each printing plate is defined as the point where the density of the 40% test pattern drops with 10% (absolutely). The results of the "useful press life" test is a measure of the press life of the plate and the results are given in Table 10.

TABLE 10 results of the run-length.

| Printing Plate | Binder* | Mol % phosphonic acid containing monomer | "Usefull Presslife" (K impressions) |
|---|---|---|---|
| PP-01 | Binder-01 | 0 | n.a.** |
| PP-06 | Binder-06 | 10 | >200 |

*see Tables 1 and 3;
**not assessable because the plate shows an unacceptable plate stain after development.

Table 10 shows that the printing plate including the binder according to the present invention has a highly improved press life.

The invention claimed is:

1. A positive-working lithographic printing plate precursor which comprises on a support having a hydrophilic surface or which is provided with a hydrophilic layer, a heat and/or light-sensitive coating comprising an infrared absorbing agent, said heat and/or light-sensitive coating comprising a first layer comprising a binder which is a polymer comprising a first polymerized monomeric unit and a second polymerized monomeric unit in the same polymer, wherein the first polymerized monomeric unit has a sulfonamide group, but not a phosphonic acid group, in each of its monomers and the second polymerized monomeric unit has a phosphonic acid group, but not a sulfonamide group, in each of its monomers, or a salt thereof; wherein the second polymerized monomeric unit is present in the polymer in an amount between 2 mol % and 15 mol %;

wherein the monomer of the second polymerized monomeric unit or salt thereof is derived from a monomer selected from vinyl phosphonic acid, a phosphonate substituted styrene derivative, a monomer according to formula I and/or a monomer according to formula II; and/or salts thereof:

Formula I

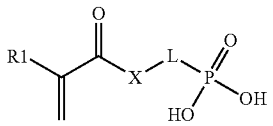

wherein $R^1$ represents hydrogen or an alkyl group;

L represents an optionally substituted alkylene, arylene, hetero-arylene, alkarylene or aralkylene group, or combinations thereof;

X represents O or $NR^2$ wherein $R^2$ represents hydrogen, an optionally substituted alkyl, alkenyl, alkynyl, aralkyl, alkaryl, aryl or heteroaryl group;

Formula II

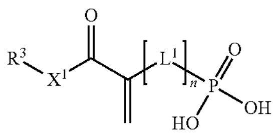

wherein $R^3$ represents hydrogen, an alkyl, alkenyl, alkynyl, aryl, aralkyl, alkaryl or heteroaryl group;

$L^1$ represents an optionally substituted alkylene, alkenylene, alkynylene, arylene, hetero-arylene, alkarylene or aralkylene group, $—X^3—(CH_2)_k—$, $—(CH_2)_l—X^4—$ or combinations thereof, wherein $X^3$ and $X^4$ independently represent O, S or NR' wherein R' represents hydrogen, an optionally substituted alkyl, alkenyl, alkynyl, aralkyl, alkaryl, aryl or heteroaryl group, and k and I independently represent an integer greater than 0;

n represents 0 or 1;

$X^1$ represents O or $NR^4$ wherein $R^4$ represents hydrogen, an optionally substituted alkyl, alkenyl, alkynyl, aralkyl, alkaryl, aryl or heteroaryl group.

2. The printing plate precursor according to claim 1, wherein the second polymerized monomeric unit is present in the polymer in an amount between 4 mol % and 10 mol %.

3. The printing plate precursor according to claim 1, wherein the monomer of the second polymerized monomeric unit or salt thereof is derived from the monomer according to formula I wherein $R^1$ represents hydrogen or an alkyl group and X represents NH.

4. The printing plate precursor according to claim 1, wherein the phosphonate substituted styrene derivative is represented by $$CHR^5{=}CR^6—C_6H_{(5-n')}\text{-}[(L^2)_p\text{-}PO_3H_2]_{n'}$$

wherein $R^5$ and $R^6$ independently represent hydrogen or an alkyl group, $L^2$ represents an optionally substituted alkylene, arylene, hetero-arylene, alkarylene or aralkylene group, or combinations thereof:

p is an integer equal to 0 or 1, and n' is an integer equal to 1, 2, 3, 4 or 5.

5. The printing plate precursor according to claim 1, wherein the sulfonamide group of the first polymerized monomeric unit is represented by $—NR^j—SO_2—$, $—SO_2—NR^k—$ wherein $R^j$ and $R^k$ each independently represent hydrogen, an optionally substituted alkyl, alkanoyl, alkenyl, alkynyl, alkaryl, cycloalkyl, heterocyclic, aryl, heteroaryl, aralkyl or heteroaralkyl group, or combinations thereof.

6. The printing plate precursor according to claim 5, wherein the monomer of the first polymerized monomeric unit is according to the formula:

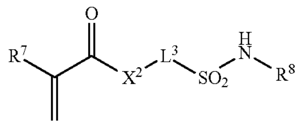

wherein $R^7$ represents hydrogen or an alkyl group;

$X^2$ represents O or $NR^9$ wherein $R^9$ represents hydrogen, an optionally substituted alkyl, alkenyl, alkynyl, aralkyl, alkaryl, aryl or heteroaryl group hydrogen or an alkyl group;

$L^3$ represents an optionally substituted alkylene, arylene, hetero-arylene, aralkylene, alkarylene group, $—O—(CH_2)_{k'}—$, $—(CH_2)_{l'}—O—$, or combinations thereof, wherein k' and l' independently represent an integer greater than 0; and $R^8$ represents hydrogen, an optionally substituted alkyl, cycloalkyl, alkenyl, alkynyl, aralkyl, alkaryl, aryl or heteroaryl group.

7. The printing plate precursor according to claim 1, wherein the polymer includes 40 to 85 mol % of the first polymerized monomeric unit.

8. The printing plate precursor according to claim 1, wherein the polymer further includes a polymerized monomeric unit wherein the monomer is selected from an acrylate, a methacrylate, an acrylamide, a methacrylamide and a maleimide.

9. The printing plate precursor according to claim 1, wherein the coating comprises a second layer including a phenolic resin; said second layer being located above the first layer.

10. The printing plate precursor according to claim 9, wherein the phenolic resin is selected from a novolac, a resol and a polyvinylphenolic resin.

11. The printing plate precursor according to claim 1, wherein the polymer comprising the first and second polymerized monomeric units or salt thereof is present in the coating in an amount between 15% wt and 85% wt.

12. A method for making a positive-working lithographic printing plate precursor comprising the steps of:

providing a support having a hydrophilic surface or which is provided with a hydrophilic layer;

applying on said support a heat and/or light-sensitive coating as defined in claim 1; and drying the coating.

13. A method for making a positive-working lithographic printing plate comprising the steps of:

a) providing a heat-sensitive lithographic printing plate precursor as defined in claim 1;

b) imagewise exposing the precursor to heat and/or infrared light;

c) developing said imagewise exposed precursor with an aqueous alkaline developer so that the exposed areas are dissolved; and d) optionally baking the obtained plate.

14. A method of printing comprising the steps of:

(i) providing a printing plate according to claim 13;

(ii) mounting the printing plate on a printing press;

(iii) supplying ink and fountain solution to the printing plate; and (iv) transferring the ink to paper.

* * * * *